United States Patent
Ikeda et al.

(10) Patent No.: US 10,692,810 B2
(45) Date of Patent: Jun. 23, 2020

(54) SEMICONDUCTOR MODULE

(71) Applicant: SHINDENGEN ELECTRIC MANUFACTURING CO., LTD., Tokyo (JP)

(72) Inventors: Kosuke Ikeda, Hanno (JP); Kenichi Suzuki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 489 days.

(21) Appl. No.: 15/511,512

(22) PCT Filed: Jul. 15, 2016

(86) PCT No.: PCT/JP2016/070958
§ 371 (c)(1),
(2) Date: Mar. 15, 2017

(87) PCT Pub. No.: WO2018/011969
PCT Pub. Date: Jan. 18, 2018

(65) Prior Publication Data
US 2019/0088594 A1 Mar. 21, 2019

(51) Int. Cl.
*H04B 3/00* (2006.01)
*H04B 15/00* (2006.01)
(Continued)

(52) U.S. Cl.
CPC ........ *H01L 23/5227* (2013.01); *H01L 25/071* (2013.01); *H01L 25/072* (2013.01);
(Continued)

(58) Field of Classification Search
CPC ... H01L 23/5227; H01L 25/072; H01L 25/18; H01L 25/07
See application file for complete search history.

(56) References Cited

U.S. PATENT DOCUMENTS

2005/0237275 A1* 10/2005 Inoue ............... G09G 3/2965
345/60
2011/0062491 A1* 3/2011 Nakata ............... H01L 25/072
257/146
(Continued)

FOREIGN PATENT DOCUMENTS

JP 2004-140068 A 5/2004
JP 2004-241734 A 8/2004
(Continued)

OTHER PUBLICATIONS

International Search Report for Application No. PCT/JP2016/070958, dated Sep. 20, 2016 (4 pages).
(Continued)

*Primary Examiner* — Rexford N Barnie
*Assistant Examiner* — Rasem Mourad
(74) *Attorney, Agent, or Firm* — Nutter McClennen & Fish LLP

(57) ABSTRACT

A semiconductor module includes a first electronic device in which one terminal is connected to a first wiring line, the other terminal is connected to a second wiring line, and a first device current flows in a first current direction from the first wiring line to the second wiring line, and a second electronic device in which one terminal is connected to a third wiring line, the other terminal is connected to a fourth wiring line, and a second device current flows in a second current direction from the third wiring line to the fourth wiring line, the first electronic device and the second electronic device being disposed such that at least part of a first magnetic flux generated by the first device current flowing in the first current direction cancels at least part of a second magnetic flux generated by the second device current.

10 Claims, 17 Drawing Sheets

(51) Int. Cl.
H01L 23/522 (2006.01)
H01L 25/07 (2006.01)
H01L 25/18 (2006.01)
H02M 7/00 (2006.01)
H01L 23/538 (2006.01)

(52) U.S. Cl.
CPC .......... *H01L 25/18* (2013.01); *H01L 23/5385* (2013.01); *H02M 7/003* (2013.01)

(56) References Cited

U.S. PATENT DOCUMENTS

2014/0084993 A1* 3/2014 Takao ................. G05F 3/20
                                                     327/534
2016/0218047 A1* 7/2016 Okumura ............... H01L 25/07
2018/0190636 A1* 7/2018 Mukunoki .......... H01L 23/5386

FOREIGN PATENT DOCUMENTS

JP   2006-222149 A   8/2006
JP   2015-225988 A   12/2015

OTHER PUBLICATIONS

English translation of International Search Report for Application No. PCT/JP2016/070958, dated Sep. 20, 2016 (2 pages) (translation posted online Jan. 18, 2018).
English translation of International Preliminary Report on Patentability, Chapter I, for Application No. PCT/JP2016/070958, dated Jan. 24, 2019 (5 pages).
Chinese Office Action for Application No. 201680002082.0, dated Feb. 28, 2020 (12 pages).

* cited by examiner

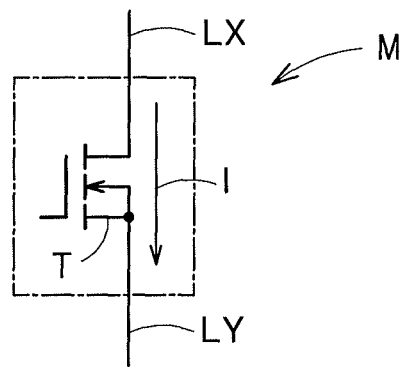
F I G. 1A
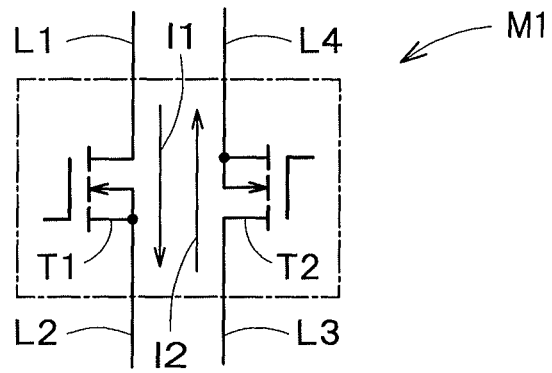
F I G. 1B
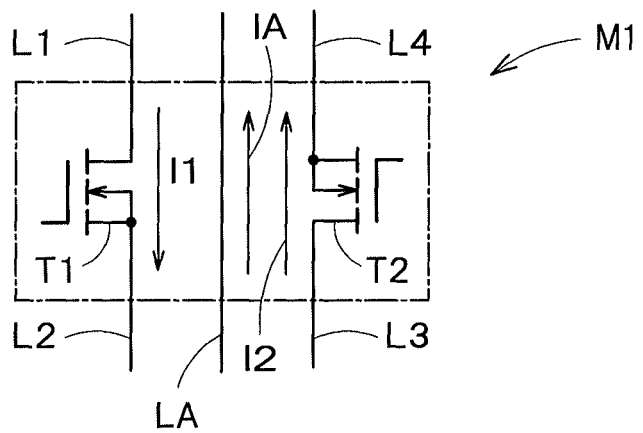
F I G. 1C

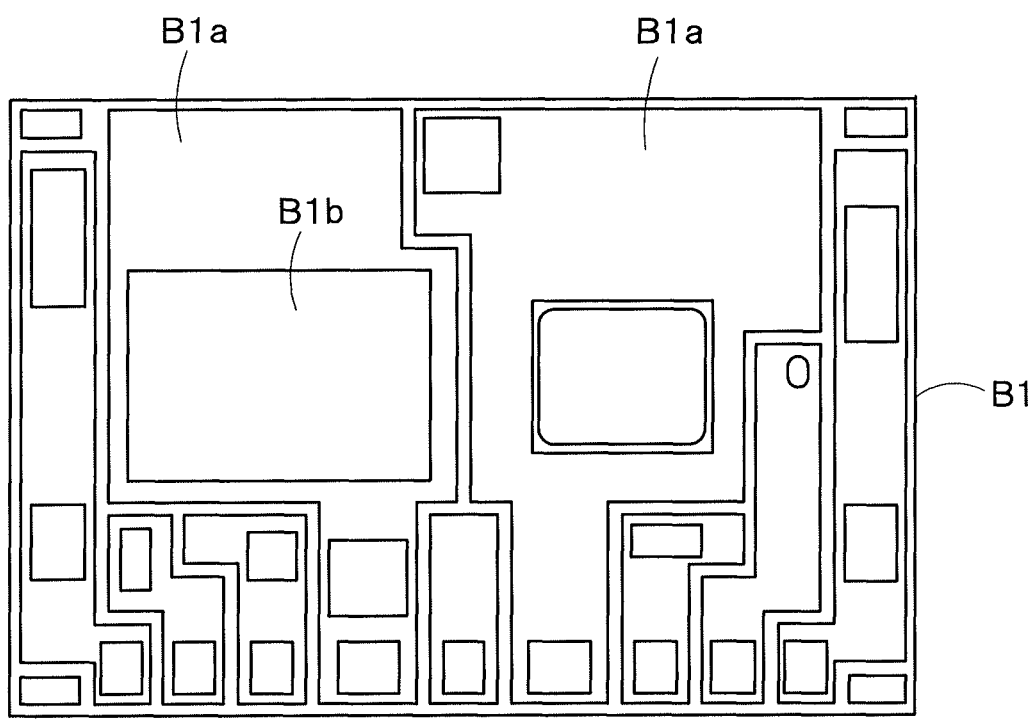
F I G. 6A
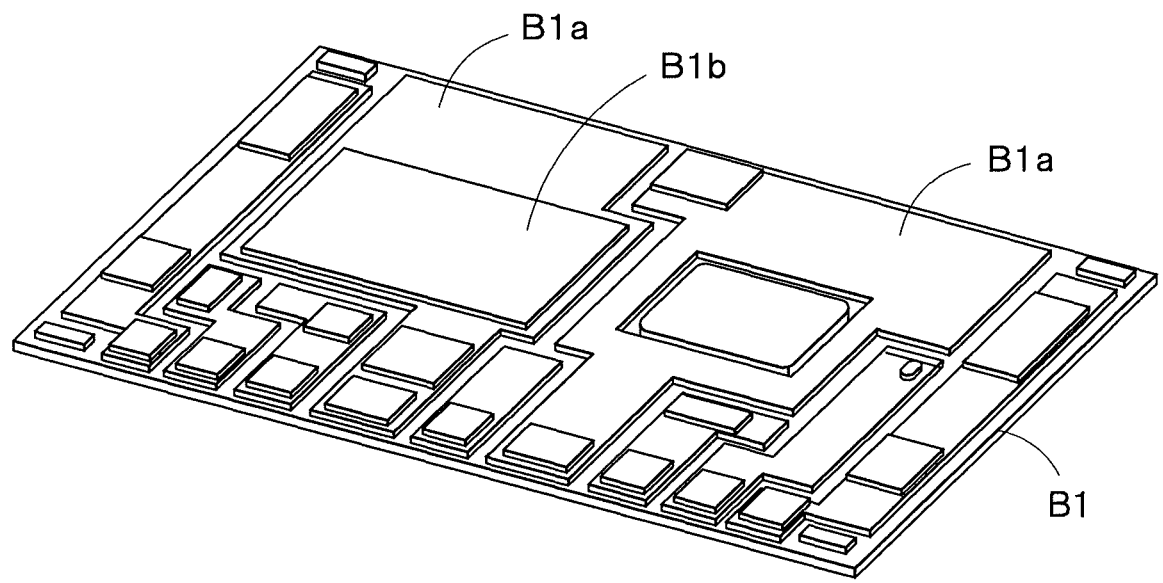
F I G. 6B

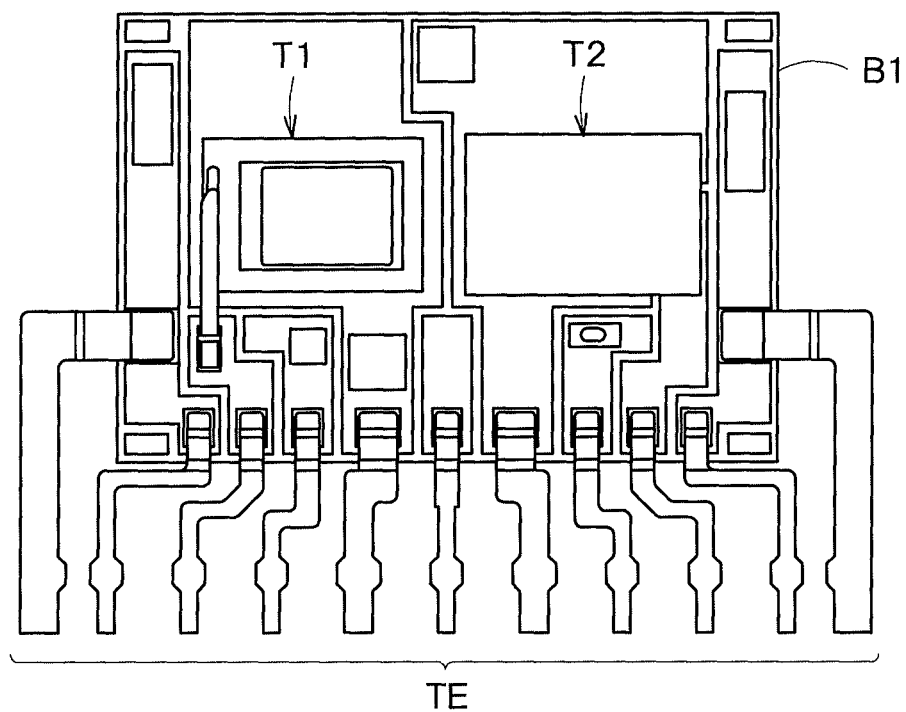
F I G. 7A
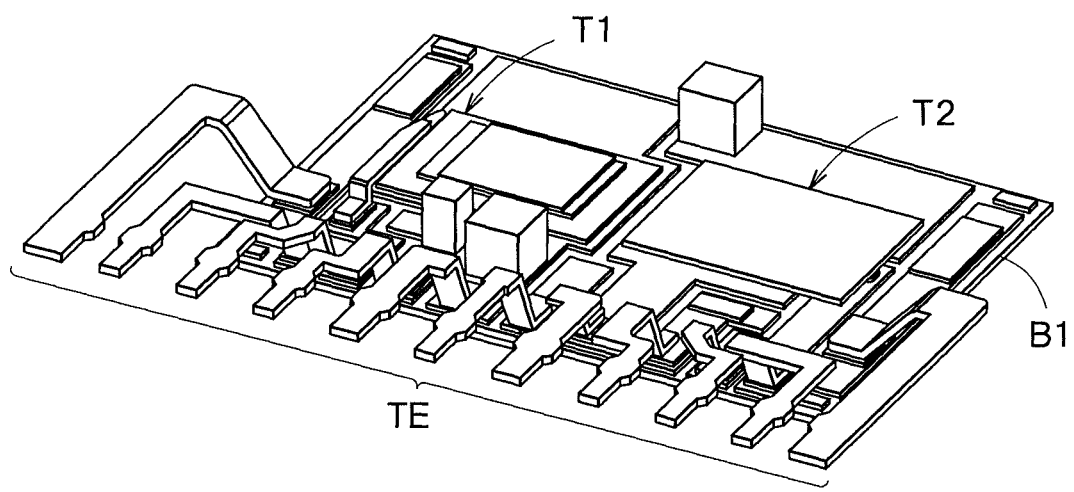
F I G. 7B

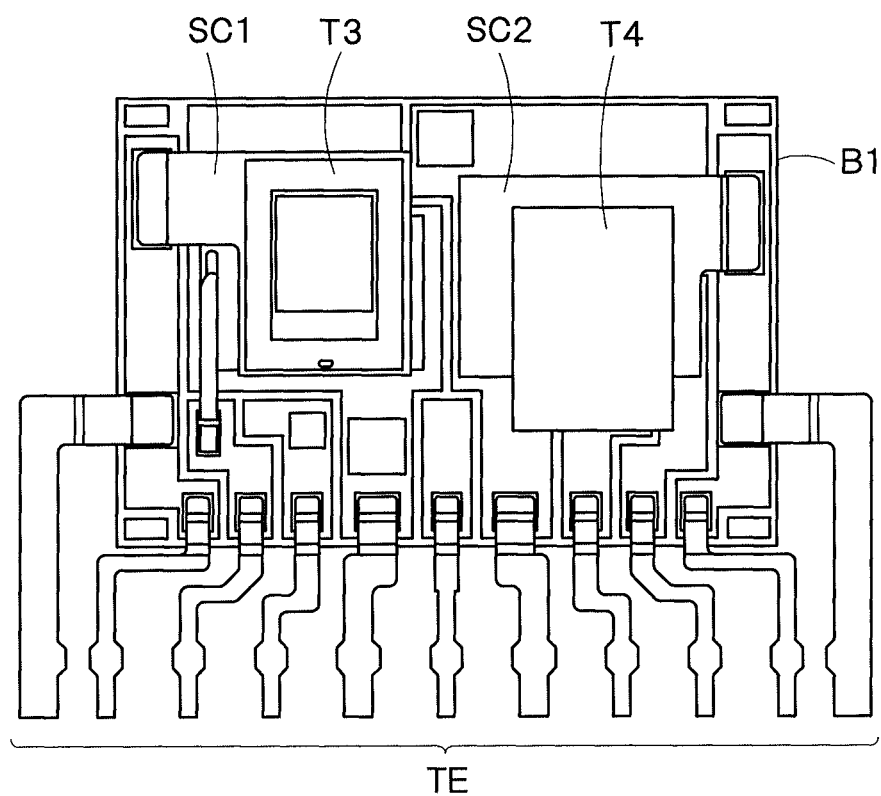
F I G. 9A
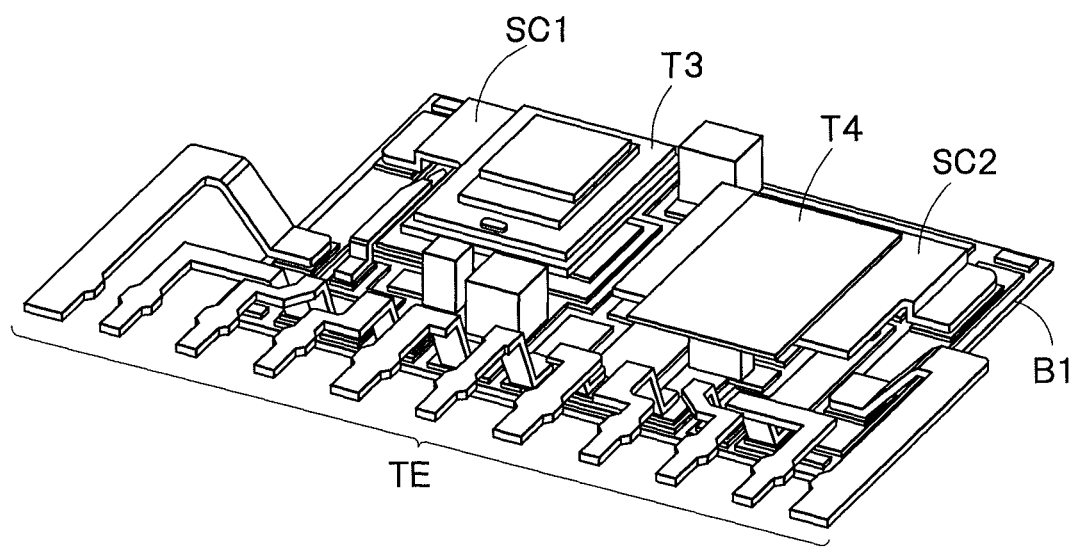
F I G. 9B

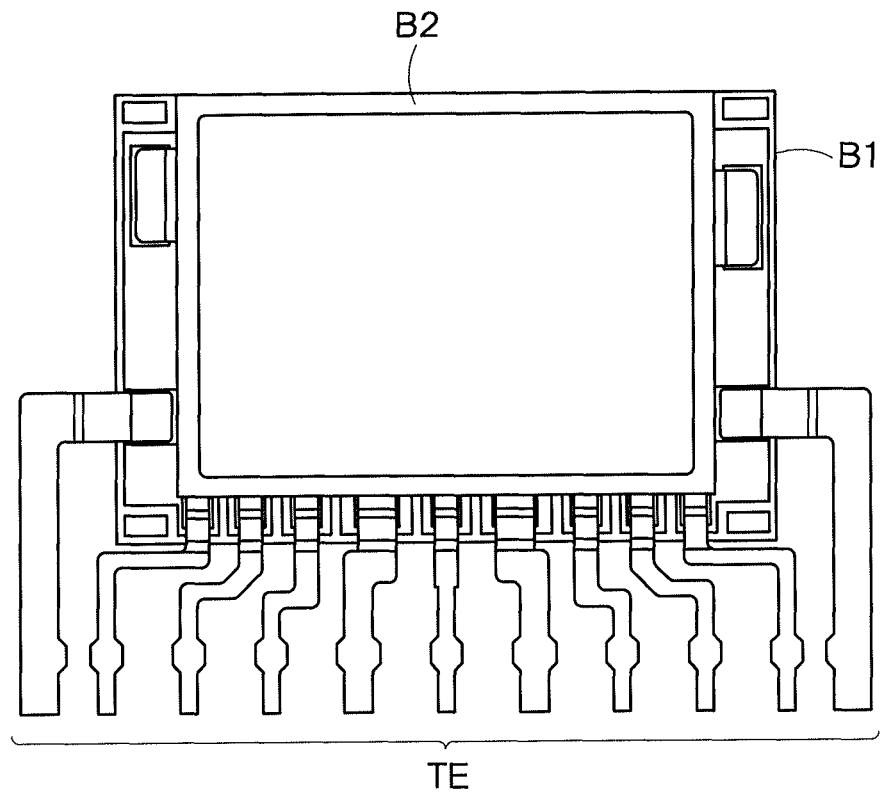
F I G. 11A
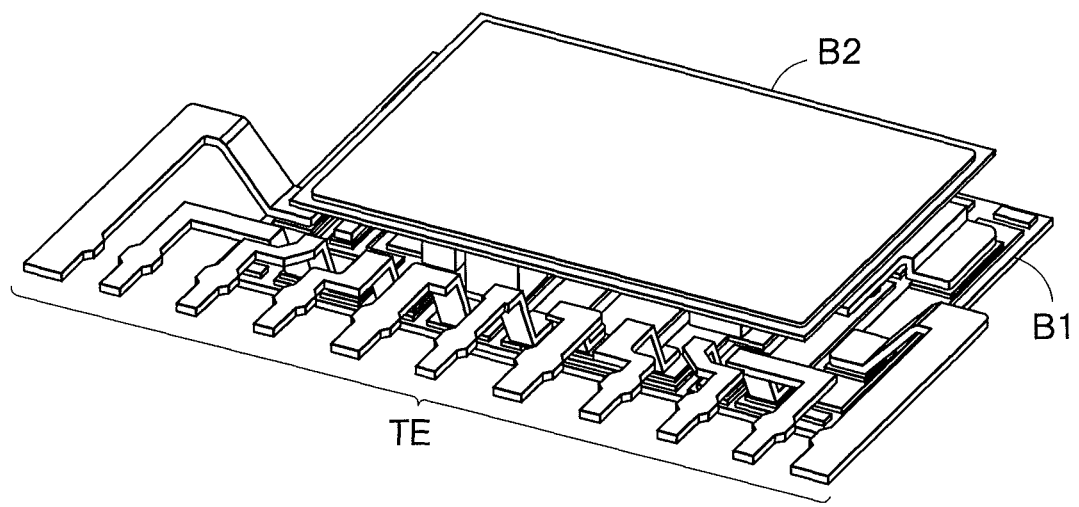
F I G. 11B

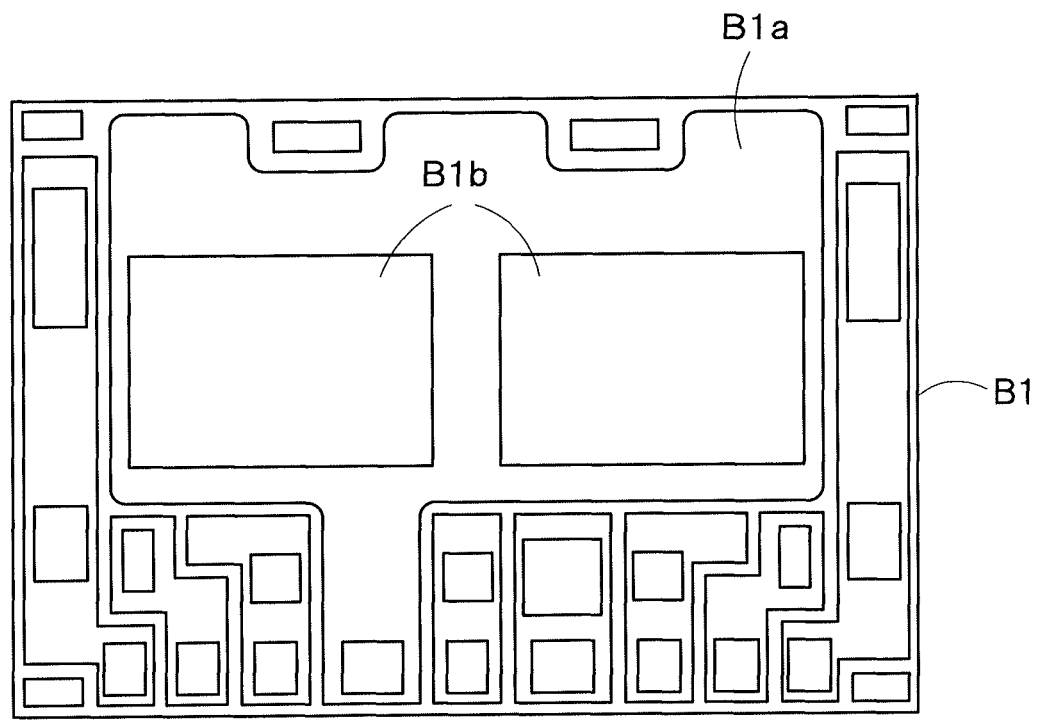
F I G. 13A
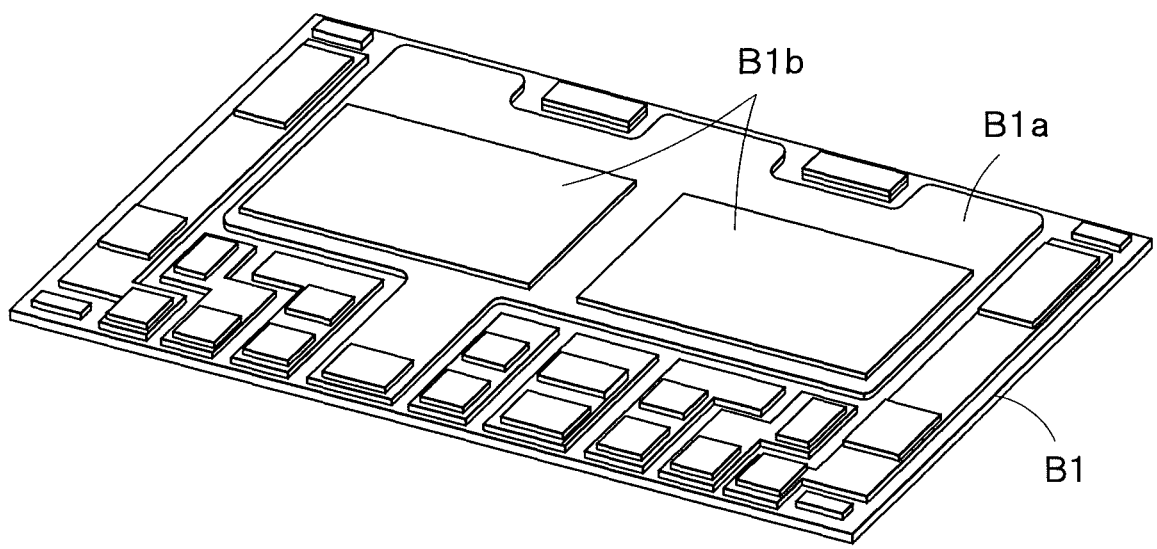
F I G. 13B

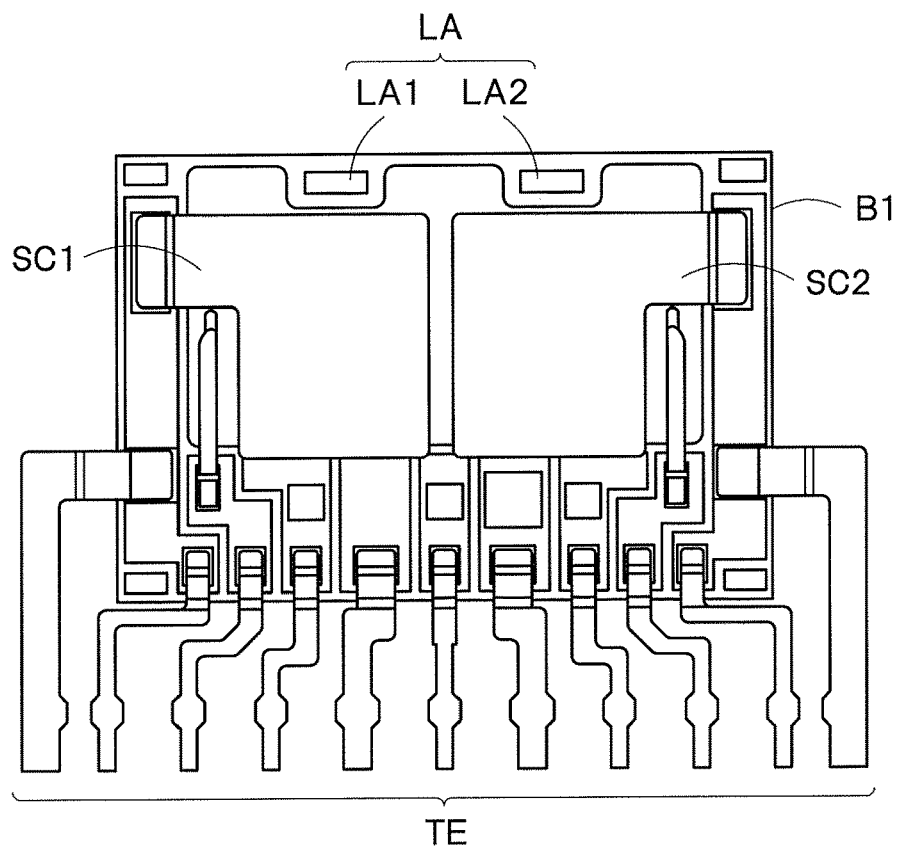
F I G. 15A
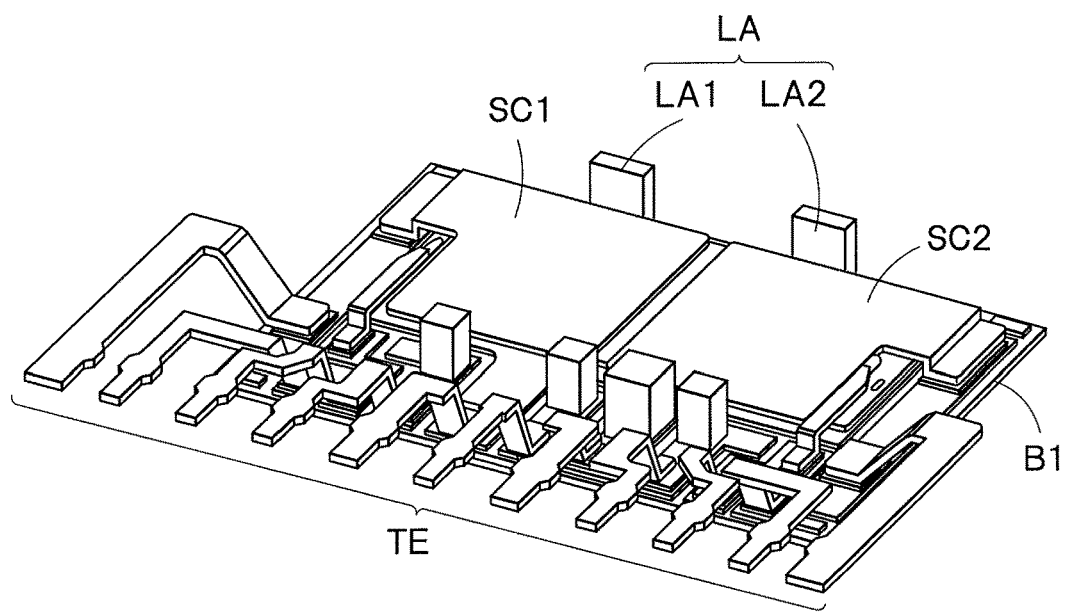
F I G. 15B

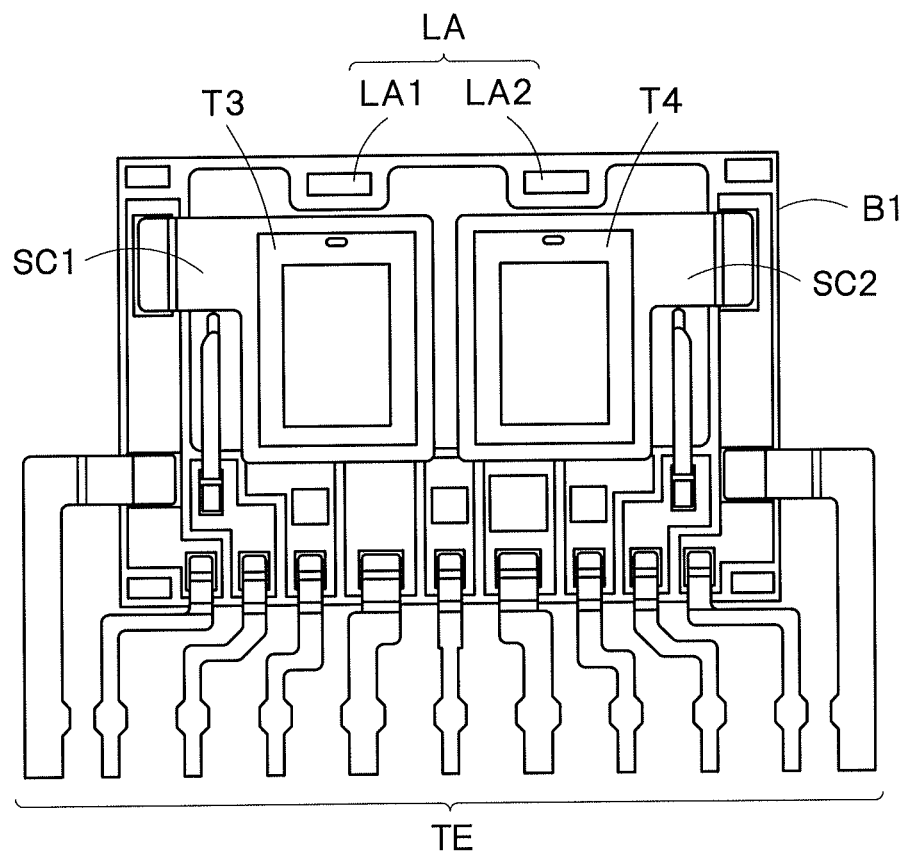
F I G. 16A
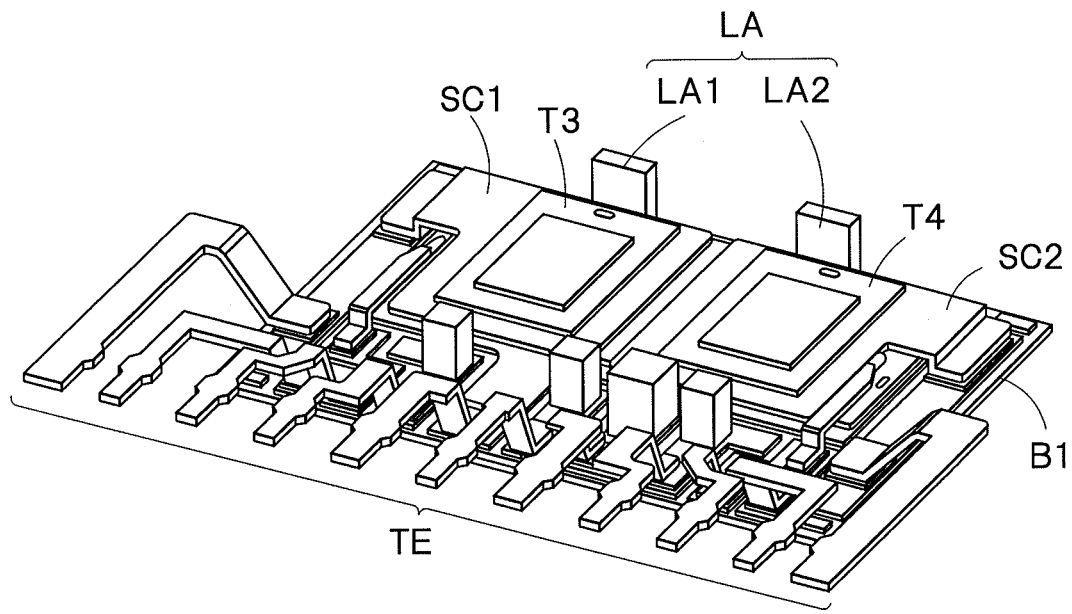
F I G. 16B

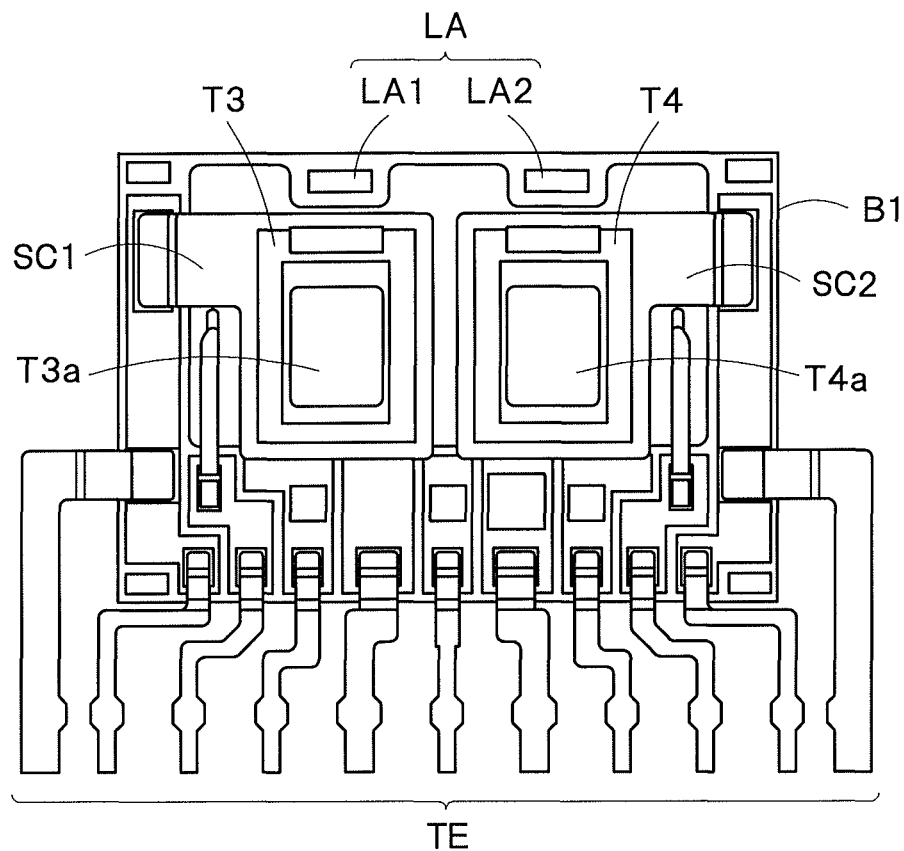
F I G. 17A
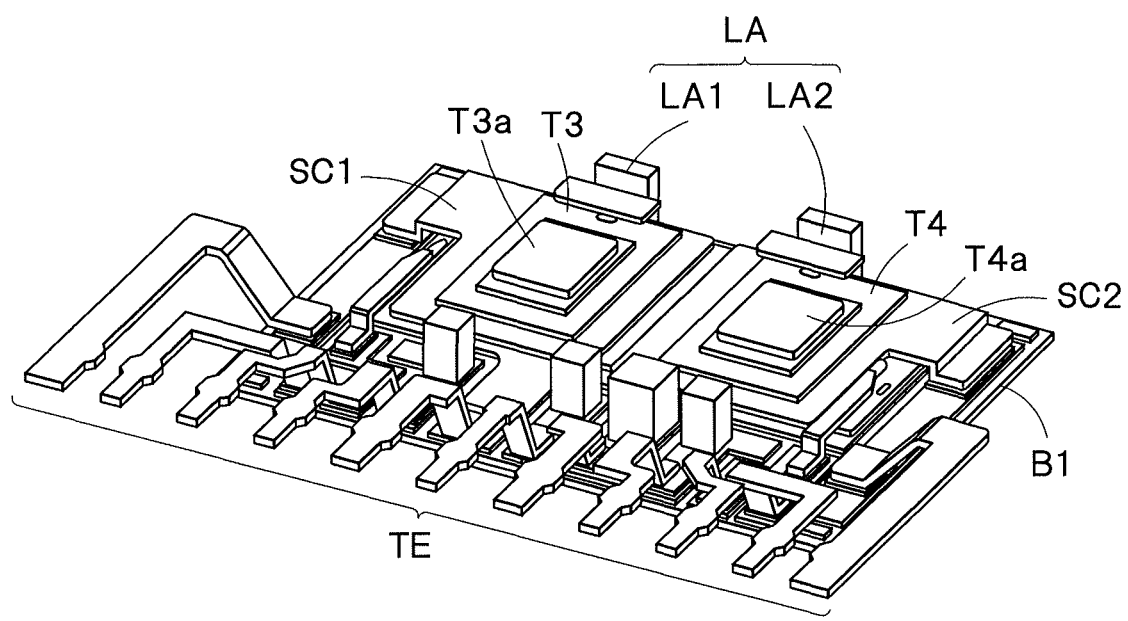
F I G. 17B

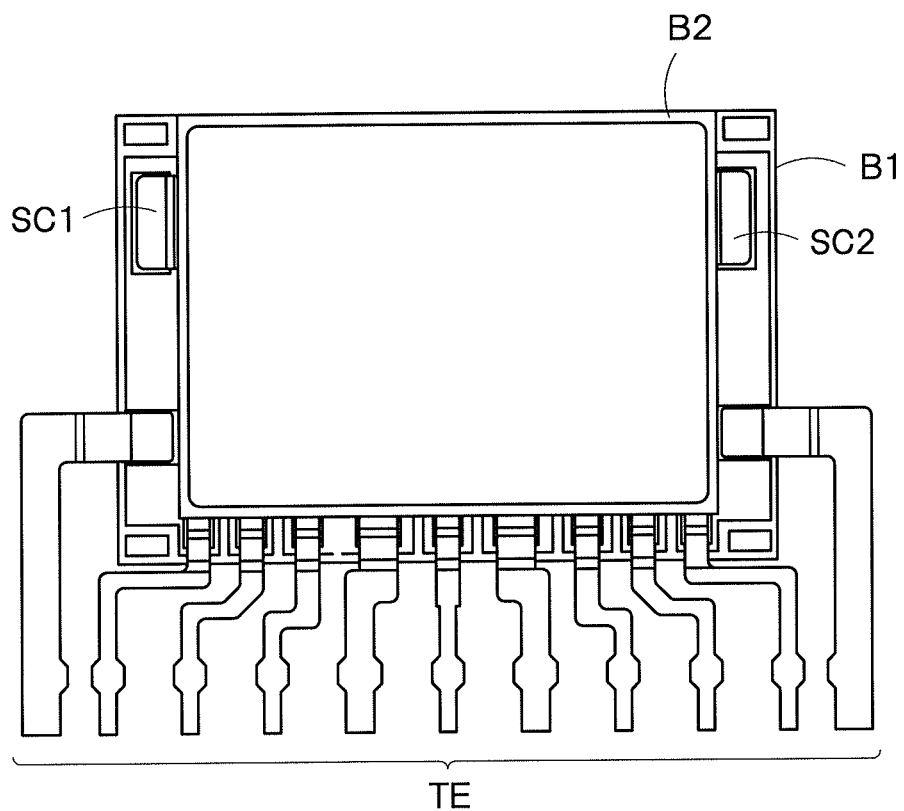
F I G. 18A
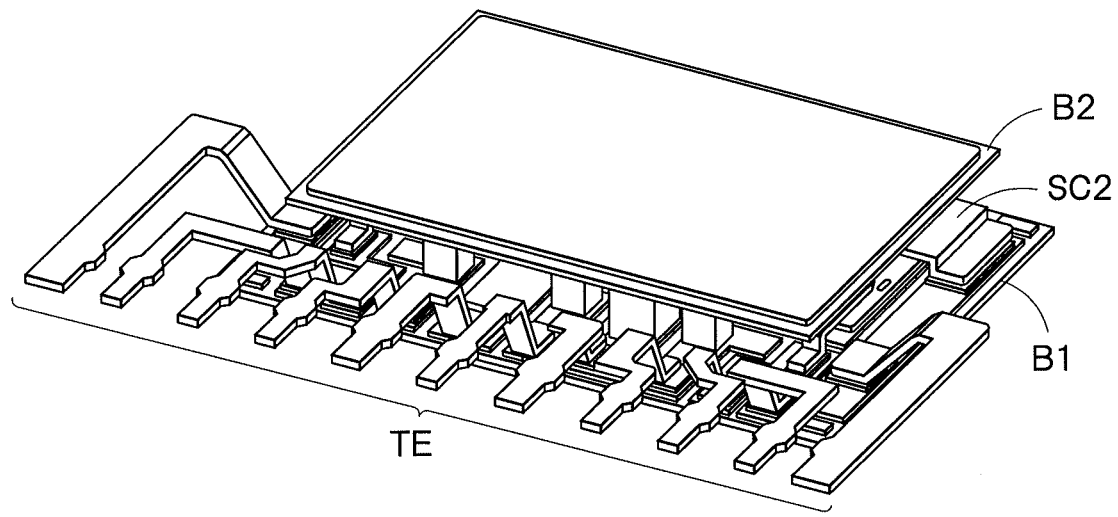
F I G. 18B

SEMICONDUCTOR MODULE

The present application claims priority under 35 U.S.C. § 365 to PCT/JP2016/070958, filed on Jul. 15, 2016, the disclosure of which are incorporated herein by reference.

TECHNICAL FIELD

The present invention relates to a semiconductor module including a plurality of electronic devices.

BACKGROUND ART

Semiconductor modules including electronic devices such as rectifier devices and switching devices have conventionally been known (for example, see Patent Document 1).

When such a semiconductor module including rectifier devices and switching devices is activated, a surge voltage may be caused by parasitic inductance of the semiconductor module, which parasitic inductance leads to a malfunction.

The semiconductor modules have limitations in layout options due to the downsizing of chips mounted on the semiconductor modules. Therefore, for example, a layout for causing a current to flow in an opposite direction to a current flowing through one of arms of a full-bridge device is difficult to form. Accordingly, the parasitic inductance in the semiconductor modules may not be appropriately reduced.

As described above, the conventional semiconductor modules have a problem in that reducing the parasitic inductance is difficult.

PRIOR ART REFERENCE

Patent Document

[Patent Document 1] JP 2015-225988 A

SUMMARY OF THE INVENTION

Problem to be Solved by the Invention

In consideration of the above problem, the present invention provides a semiconductor module capable of reducing parasitic inductance.

Solution to Problem

A semiconductor module according to an aspect of the present invention includes:

a first electronic device in which one terminal is connected to a first wiring line, the other terminal is connected to a second wiring line, and a first device current flows in a first current direction from the first wiring line to the second wiring line; and a second electronic device in which one terminal is connected to a third wiring line, the other terminal is connected to a fourth wiring line, and a second device current flows in a second current direction from the third wiring line to the fourth wiring line;

wherein the first electronic device and the second electronic device are arranged so that at least part of a first magnetic flux generated by the first device current flowing in the first current direction cancels at least part of a second magnetic flux generated by the second device current flowing in the second current direction to reduce mutual inductance.

In the semiconductor module, the first current direction in which the first device current flows and the second current direction in which the second device current flows may be parallel to each other.

In the semiconductor module, a value of the first device current is the same as a value of the second device current.

The semiconductor module further includes a regulation wiring line in which a regulation current that is different from the first device current and the second device current flows, wherein the regulation wiring line is arranged so that at least part of a magnetic flux generated by the regulation current flowing in the regulation wiring line cancels at least part of the first magnetic flux to reduce mutual inductance.

The semiconductor module further includes:

a third electronic device in which one terminal is connected to a fifth wiring line, the other terminal is connected to a sixth wiring line, and a third device current flows in a third current direction from the fifth wiring line to the sixth wiring line; and a fourth electronic device in which one terminal is connected to a seventh wiring line, the other terminal is connected to an eighth wiring line, and a fourth device current flows in a fourth current direction from the seventh wiring line to the eighth wiring line, wherein the third electronic device and the fourth electronic device are arranged so that at least part of a third magnetic flux generated by the third device current flowing in the third current direction cancels at least part of a fourth magnetic flux generated by the fourth device current flowing in the fourth current direction to reduce mutual inductance.

In the semiconductor module, the third current direction in which the third device current flows and the fourth current direction in which the fourth device current flows are parallel to each other.

In the semiconductor module, a value of the third device current is the same as a value of the fourth device current.

In the semiconductor module:

the first electronic device is a first switching device in which one terminal is connected to a first power supply terminal and the other terminal is connected to a first output terminal;

the second electronic device is a second switching device in which one terminal is connected to a second output terminal and the other terminal is connected to a second power supply terminal, the second electronic device being controlled to be turned on or off in synchronization with the first switching device;

the third electronic device is a third switching device in which one terminal is connected to the first output terminal and the other terminal is connected to the second power supply terminal;

the fourth electronic device is a fourth switching device in which one terminal is connected to the first power supply terminal and the other terminal is connected to the second output terminal, the fourth electronic device being controlled to be turned on or off in synchronization with the third switching device; and the first switching device and the third switching device are controlled to be complementarily turned on or off.

In the semiconductor module:

the first electronic device is a first switching device in which one terminal is connected to a first power supply terminal and the other terminal is connected to a first output terminal;

the second electronic device is a second switching device in which one terminal is connected to the first power supply terminal and the other terminal is connected to the first output terminal, the second electronic device being controlled to be turned on or off in synchronization with the first switching device;

the third electronic device is a third switching device in which one terminal is connected to the first output terminal and the other terminal is connected to the second power supply terminal;

the fourth electronic device is a fourth switching device in which one terminal is connected to the first output terminal and the other terminal is connected to the second power supply terminal, the fourth electronic device being controlled to be turned on or off in synchronization with the third switching device; and the first switching device and the third switching device are controlled to be complementarily turned on or off.

A semiconductor module according to another aspect of present invention includes:

a first wiring line substrate;

a first electronic device disposed above the first wiring line substrate, one terminal of the first electronic device being electrically connected to the first wiring line substrate;

a first connection wiring layer disposed above the first electronic device and electrically connected to the other terminal of the first electronic device;

a second electronic device disposed above the first wiring line substrate in the vicinity of the first electronic device, one terminal of the second electronic device being electrically connected to the first wiring line substrate;

a second connection wiring layer disposed above the second electronic device in the vicinity of the first connection wiring layer, and connected to the other terminal of the second electronic device;

the third electronic device disposed above the first connection wiring layer, in which one terminal is electrically connected to the first connection wiring layer;

the fourth electronic device disposed above the second connection wiring layer in the vicinity of the third electronic device, one terminal of the fourth electronic device being electrically connected to the second connection wiring layer; and a second wiring line substrate disposed above the third electronic device and the fourth electronic device, and electrically connected to the other terminal of the third electronic device and the other terminal of the fourth electronic device, wherein:

a first device current flows in a first current direction from the one terminal to the other terminal of the first electronic device, a second device current flows in a second current direction from the other terminal to the one terminal of the second electronic device, a third device current flows in a third current direction from the one terminal to the other terminal of the third electronic device;

a fourth device current flows in a fourth current direction from the other terminal to the one terminal of the fourth electronic device; and at least part of a magnetic flux generated by the first drive current and the third device current cancels at least part of a magnetic flux generated by the second drive current and the fourth to reduce mutual inductance.

A semiconductor module according to a still further aspect of the present invention includes:

a first wiring line substrate;

a first electronic device disposed above the first wiring line substrate, one terminal of the first electronic device being electrically connected to the first wiring line substrate;

a first connection wiring layer disposed above the first electronic device and electrically connected to the other terminal of the first electronic device;

a second electronic device disposed above the first wiring line substrate in the vicinity of the first electronic device, one terminal of the second electronic device being electrically connected to the first wiring line substrate;

a second connection wiring layer disposed above the second electronic device in the vicinity of the first connection wiring layer, and electrically connected to the other terminal of the second electronic device;

the third electronic device disposed above the first connection wiring layer, one terminal of the third electronic device being electrically connected to the first connection wiring layer;

the fourth electronic device disposed above the second connection wiring layer in the vicinity of the third electronic device, one terminal of the fourth electronic device being electrically connected to the second connection wiring layer;

a second wiring line substrate disposed above the third electronic device and the fourth electronic device; and a regulation wiring line disposed to extend between the first wiring line substrate and the second wiring line substrate, wherein:

a first device current flows in a first current direction from the one terminal to the other terminal of the first electronic device;

a second device current flows in a second current direction from the one terminal to the other terminal of the second electronic device;

a third device current flows in a third current direction from the one terminal to the other terminal of the third electronic device;

a fourth device current flows in a fourth current direction from the one terminal to the other terminal of the fourth electronic device;

a regulation current that is different from the first to fourth device currents flows through the regulation wiring line in a fifth current direction from the second wiring line substrate to the first wiring line substrate; and at least part of a magnetic flux generated by the regulation current cancels at least part of a magnetic flux generated by the first to fourth device currents to reduce mutual inductance.

In the semiconductor module:

the regulation wiring line includes a first regulation wiring line which is disposed in the vicinity of the first and third electronic devices and in which a first regulation current flows, and a second regulation wiring line which is disposed in the vicinity of the second and fourth electronic devices and in which a second regulation current flows;

at least part of a magnetic flux generated by the first regulation current cancels at least part of a magnetic flux generated by the first and third device currents to reduce mutual inductance; and at least part of a magnetic flux generated by the second regulation current cancels at least part of a magnetic flux generated by the second and fourth device currents to reduce mutual inductance.

In the semiconductor module, the first electronic device is a switching device or rectifier device, and the second electronic device is a switching device or rectifier device.

In the semiconductor module, the switching device is a transistor.

In the semiconductor module, the rectifier device is a diode.

Effect of the Invention

According to the present invention, a semiconductor module capable of reducing parasitic inductance may be provided.

BRIEF DESCRIPTIONS OF THE DRAWINGS

FIG. 1A is a circuit diagram showing an example of a configuration of a typical MOSFET semiconductor module M.

FIG. 1B is a circuit diagram showing an example of a semiconductor module M1 according to a first embodiment, which is an aspect of the present invention.

FIG. 1C is a circuit diagram showing another example of a semiconductor module M2 according to the first embodiment, which is an aspect of the present invention.

FIG. 6A is a plan view developed for explaining the respective elements of the semiconductor module shown in FIG. 5A.

FIG. 6B is a perspective view developed for explaining the respective elements of the semiconductor module shown in FIG. 5B.

FIG. 7A is a plan view developed for explaining the respective elements of the semiconductor module shown in FIG. 5A.

FIG. 7B is a perspective view developed for explaining the respective elements of the semiconductor module shown in FIG. 5B.

FIG. 9A is a plan view developed for explaining the respective elements of the semiconductor module shown in FIG. 5A.

FIG. 9B is a perspective view developed for explaining the respective elements of the semiconductor module shown in FIG. 5B.

FIG. 11A is a plan view developed for explaining the respective elements of the semiconductor module shown in FIG. 5A.

FIG. 11B is a perspective view developed for explaining the respective elements of the semiconductor module shown in FIG. 5B.

FIG. 13A is a plan view developed for explaining the respective elements of the semiconductor module shown in FIG. 12A.

FIG. 13B is a perspective view developed for explaining the respective elements of the semiconductor module shown in FIG. 12B.

FIG. 15A is a plan view developed for explaining the respective elements of the semiconductor module shown in FIG. 12A.

FIG. 15B is a perspective view developed for explaining the respective elements of the semiconductor module shown in FIG. 12B.

FIG. 16A is a plan view developed for explaining the respective elements of the semiconductor module shown in FIG. 12A.

FIG. 16B is a perspective view developed for explaining the respective elements of the semiconductor module shown in FIG. 12B.

FIG. 17A is a plan view developed for explaining the respective elements of the semiconductor module shown in FIG. 12A.

FIG. 17B is a perspective view developed for explaining the respective elements of the semiconductor module shown in FIG. 12B.

FIG. 18A is a plan view developed for explaining the respective elements of the semiconductor module shown in FIG. 12A.

FIG. 18B is a perspective view developed for explaining the respective elements of the semiconductor module shown in FIG. 12B.

EMBODIMENTS FOR CARRYING OUT THE INVENTION

Embodiments of the present invention will now be described with reference to the accompanying drawings.

First Embodiment

Figure 2A:
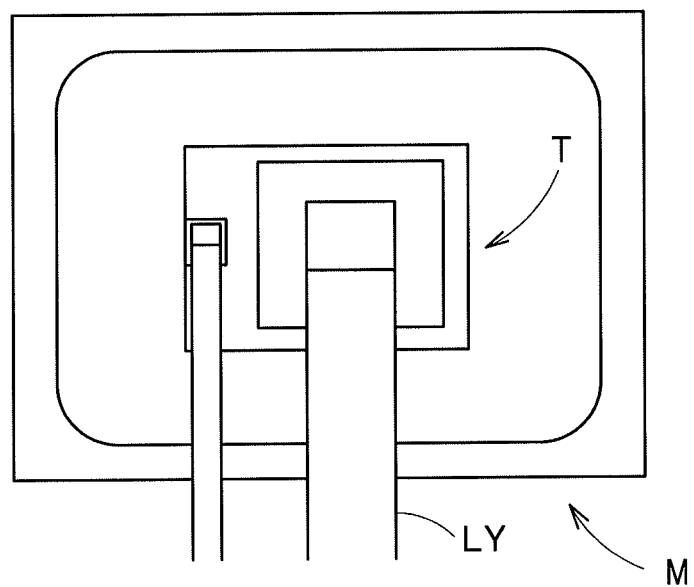
FIG. 2A is a plan view showing an example of a planar arrangement of the MOSFET semiconductor module M shown in FIG. 1A.
Figure 2B:
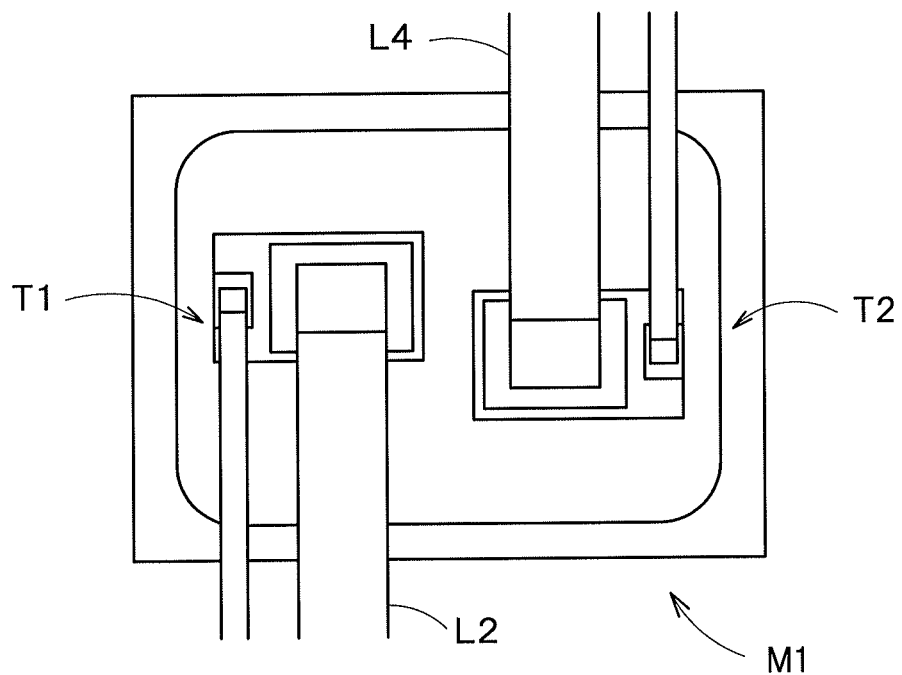
FIG. 2B is a plan view showing an example of a planar arrangement of the MOSFET semiconductor module M1 shown in FIG. 1B.

FIG. 1A is a circuit diagram showing an example of a configuration of a typical MOSFET semiconductor module M. FIG. 1B is a circuit diagram showing an example of a configuration of a semiconductor module M1 according to a first embodiment, which is an aspect of the present invention. FIG. 1C is a circuit diagram showing another example of a configuration of a semiconductor module M2 according to the first embodiment, which is an aspect of the present invention. FIG. 2A is a plan view showing an example of a planar arrangement of the MOSFET semiconductor module M shown in FIG. 1A. FIG. 2B is a plan view showing an example of a planar arrangement of the MOSFET semiconductor module M1 shown in FIG. 1B.

For example, the semiconductor module M, which is a typical discrete package, includes an electronic device T (FIGS. 1A and 2A). One terminal (drain) of the electronic device T is connected to a wiring line LX, and the other terminal (source) is connected to a wiring line LY. The electronic device T is turned off to limit a current, and turned on to cause a device current I to flow in a current direction from the wiring line LX to the wiring line LY. The device current I and parasitic inductance that is not shown generate a surge voltage as described above. The surge voltage causes malfunctions etc.

A basic principle of the semiconductor module M1 according to the first embodiment will be described, in which devices having a half chip size are mounted to have rating that is equivalent to the rating of one device in a discrete package, and currents flow in the devices in opposite directions.

The semiconductor module M1 includes a first electronic device (MOSFET) T1 and a second electronic device (MOSFET) T2 as shown in FIGS. 1B and 2B.

One terminal (drain) of the first electronic device T1 is connected to a first wiring line L1 and the other terminal (source) is connected to a second wiring line L2. The first electronic device T1 is turned off to limit a current, and turned on to cause a first device current I1 to flow in a first current direction from the first wiring line L1 to the second wiring line L2.

One terminal of the second electronic device T2 is connected to a third wiring line L3, and the other terminal is connected to a fourth wiring line L4. The second electronic device T2 is turned off to limit a current, and turned on to cause a second device current I2 to flow in a second current direction from the third wiring line L3 to the fourth wiring line L4.

The second electronic device T2 is controlled to be on or off in synchronization with the first electronic device T1. Therefore, the first device current I1 and the second device current I2 flow through the first electronic device T1 and the second electronic device T2 at the same time.

The first electronic device T1 and the second electronic device T2 are arranged such that at least part of a first magnetic flux generated by the first device current I1 flowing in the first current direction cancels at least part of a second magnetic flux generated by the second device current I2 flowing in the second current direction to reduce mutual inductance.

Preferably, the first current direction in which the first device current I1 flows and the second current direction in which the second device current I2 flows are set to be "parallel" to each other. In the embodiments, the term "parallel" means not only a case where the angle of the first current direction of the first device current I1 completely matches the angle of the second current direction of the second device current I2, but also a case where the first device current I1 is substantially parallel to the second device current I2 to have an effect that the first magnetic flux generated by the first device current I1 flowing in the first current direction cancels the second magnetic flux generated by the second device current I2 flowing in the second current direction (this also applies to the following embodiments).

As a result, the ratio at which the first magnetic flux generated by the first device current I1 flowing in the first current direction cancels the second magnetic flux generated by the second device current I2 flowing in the second current direction increases, which further reduces the mutual inductance.

More preferably, the value of the first device current I1 and the value of the second device current I2 are set to be "the same" as each other. In the embodiments, "the same" means not only a case where the value of the first device current I1 and the value of the second device current I2 are completely identical to each other, but also a case where the value of the first device current I1 is substantially identical to the value of the second device current I2, by which the ratio at which the first magnetic flux generated by the first device current I1 flowing in the first current direction cancels the second magnetic flux generated by the second device current I2 flowing in the second current direction becomes higher (this also applies to the following embodiments).

Therefore, devices with, for example, a half chip size are mounted on a discrete package so as to have rating that is equivalent to the rating of one device.

As a result, the first magnetic flux generated by the first device current I1 flowing in the first current direction cancels the second magnetic flux generated by the second device current I2 flowing in the second current direction to considerably reduce the mutual inductance.

Since the parasitic inductance of the semiconductor module M1 is reduced in this manner, the voltage and current surge is considerably reduced.

As shown in, for example, FIG. 1C, the semiconductor module M1 may further include a regulation wiring line LA through which a regulation current IA that is different from the first device current I1 or the second device current I2 flows.

The regulation wiring line LA is arranged in a manner that at least part of the magnetic flux generated by the regulation current IA flowing through the regulation wiring line LA cancels at least part of the first magnetic flux generated by the first device current I1, thereby reducing the mutual inductance.

As a result, as compared with the example shown in FIG. 1B, the mutual inductance may be reduced more accurately by controlling the regulation current IA.

The examples shown in FIGS. 1B and 1C have been explained for the case where the first and second electronic devices T1 and T2 are switching devices (MOSFETs). The switching devices may also be bipolar transistors, GaNFETs, IGBTs, or other transistors. Thus, transistors containing, for example, GaN, Si, SiC, or GaAs may be used as the switching devices (this also applies to the following embodiments). The first and second electronic devices T1 and T2 may also be rectifier devices such as diodes.

(Modification 1)

A modification in which the above-described semiconductor module is applied to a half-bridge circuit will be described.

Figure 3:
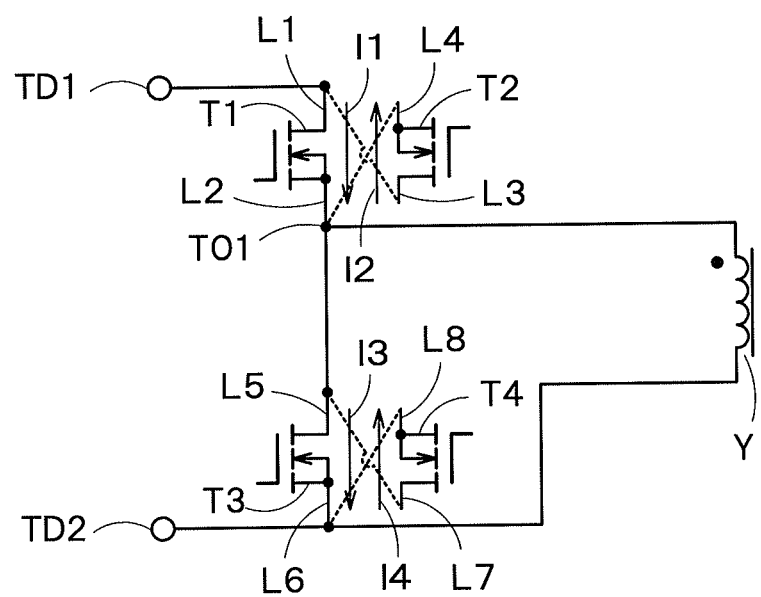
FIG. 3 is a circuit diagram showing an example of a configuration of a half-bridge-circuit semiconductor module MH1 according to the first embodiment, which is an aspect of the present invention.

FIG. 3 is a circuit diagram showing an example of a configuration of a semiconductor module MH1 according to the first embodiment, which is an aspect of the present invention, the semiconductor module MH1 being a half-bridge circuit. In FIG. 3, the reference signs that are common to FIGS. 1B and 1C indicate the same elements, and the explanations for these elements are omitted.

The semiconductor module MH1 including the half-bridge circuit according to Modification 1 includes, for example, a first electronic device (MOSFET) T1, a second electronic device (MOSFET) T2, a third electronic device (MOSFET) T3, and a fourth electronic device T (MOSFET) 4, as shown in FIG. 3. In the example shown in FIG. 3, a primary side coil Y of a transformer is connected between the first output terminal TO1 and a second power supply terminal TD2 of the semiconductor module MH1. A positive electrode of a battery (not shown), for example, is connected to a first power supply terminal TD1, and a negative electrode of the battery is connected to a second power supply terminal TD2.

The first electronic device T1 is a first switching device (MOSFET), in which one terminal (drain) is connected to the first power supply terminal TD1 via a first wiring line L1, and the other terminal (source) is connected to the first output terminal TO1 via a second wiring line L2.

The second electronic device T2 is a second switching device (MOSFET), in which one terminal (drain) is connected to the first power supply terminal TD1 via a third wiring line L3, and the other terminal (source) is connected to the first output terminal TO1 via a fourth wiring line L4. The second switching device T2 is controlled to be turned on or off in synchronization with the first switching device T1.

One terminal of the third electronic device T3 is connected to a fifth wiring line L5, and the other terminal is connected to a sixth wiring line L6. The third electronic device T3 is turned off to limit a current, and turned on to cause a third device current I3 to flow in a third current direction from the fifth wiring line L5 to the sixth wiring line L6.

The third electronic device T3 is a third switching device, in which the one terminal is connected to the first output terminal TO1 via the fifth wiring line L5, and the other terminal is connected to the second power supply terminal TD2 via the sixth wiring line L6.

One terminal of the fourth electronic device T4 is connected to a seventh wiring line L7, and the other terminal is connected to an eighth wiring line L8. The fourth electronic device T4 is turned off to limit a current, and turned on to cause a fourth device current I4 to flow in a fourth current direction from the seventh wiring line L7 to the eighth wiring line L8.

The fourth electronic device T4 is a fourth switching device T4 in which the one terminal is connected to the first output terminal TO1 via the seventh wiring line L7, and the other terminal is connected to the second power supply terminal TD2 via the eighth wiring line L8. The fourth electronic device T4 is controlled to be turned on or off in synchronization with the third switching device T3.

The first switching device T1 and the third switching device T3 are controlled to be complementarily turned on or off.

Like the arrangement of the first electronic device T1 and the second electronic device T2 described above, the third electronic device T3 and the fourth electronic device T4 are arranged so that at least part of a third magnetic flux generated by the third device current I3 flowing in the third current direction cancels at least part of a fourth magnetic flux generated by the fourth device current I4 flowing in the fourth current direction, thereby reducing the mutual inductance.

Preferably, the third current direction in which the third device current I3 flows is parallel to the fourth current direction in which the fourth device current I4 flows.

This increases the ratio at which the third magnetic flux generated by the third device current I3 flowing in the third current direction cancels the fourth magnetic flux generated by the fourth device current I4 flowing in the fourth current direction, and leads to a further reduction in mutual inductance.

More preferably, the value of the third device current I3 is set to be equal to the value of the fourth device current I4.

This allows the third magnetic flux generated by the third device current I3 flowing in the third current direction to cancel the fourth magnetic flux generated by the fourth device current I4 flowing in the fourth current direction, thereby considerably reducing the mutual inductance.

Like the above-described example shown in FIG. 1C, a regulation wiring line (not shown) may further be included, in which a regulation current that is different from the third device current I3 or the fourth device current I4 flows. In this case, the regulation wiring line is arranged so that at least part of a magnetic flux generated by the regulation current flowing through the regulation wiring line cancels at least part of the third magnetic flux and the fourth magnetic flux generated by the third device current I3 and the fourth device current I4, thereby reducing the mutual inductance. Thus, the mutual inductance may be reduced with accuracy by controlling the regulation current.

As described above, the parasitic inductance of the semiconductor module MH1, which is a half-bridge circuit, may be reduced by an arrangement in which a current is caused to flow in an opposite direction to the current flowing through the arm. The reduction in parasitic inductance leads to a considerable reduction in voltage and current surge.

The regulation wiring line in the example described with reference to FIG. 1C may be applied to the semiconductor module MH1 to reduce the mutual inductance.

The connection relationship in this semiconductor module MH1 with a half bridge configuration has been explained on the assumption that the second electronic device T2 and the fourth electronic device T4 are included in the half bridge configuration. However, the second electronic device T2 and the fourth electronic device T4 may be included in another circuit configuration.

(Modification 2)

Next, a modification in which the above-described semiconductor module is applied to a full-bridge circuit will be described.

Figure 4:
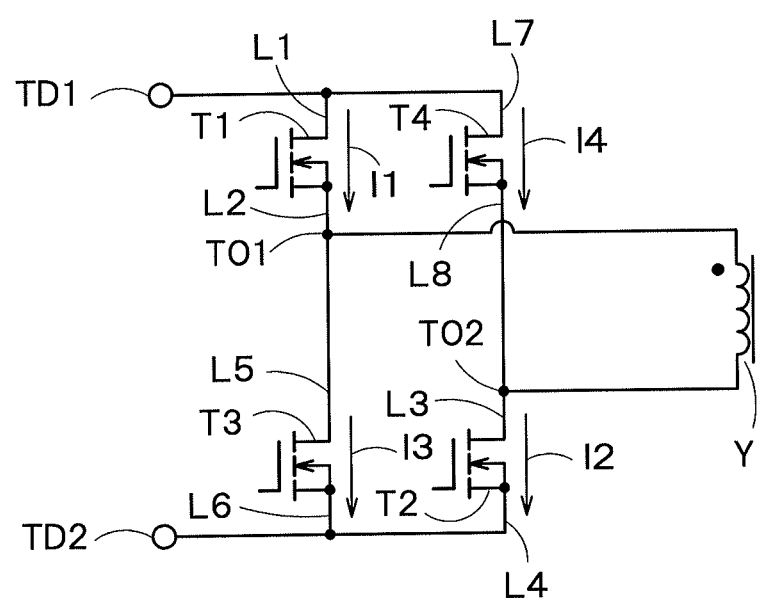
FIG. 4 is a circuit diagram showing an example of a configuration of a semiconductor module MF1 including a full-bridge circuit according to the first embodiment, which is an aspect of the present invention.

FIG. 4 is a circuit diagram showing an example of a configuration of a semiconductor module MF1 including a full-bridge circuit according to the first embodiment, which is an aspect of the present invention. In FIG. 4, the reference signs that are common to FIG. 3 indicate the same elements, and the explanations for these elements are omitted.

The semiconductor module MF1 with a full-bridge circuit according to Modification 2 includes, for example, a first electronic device (MOSFET) T1, a second electronic device (MOSFET) T2, a third electronic device (MOSFET) T3, and a fourth electronic device (MOSFET) T4, as shown in FIG. 4. In the example shown in FIG. 4, a primary side coil Y of a transformer is connected between a first output terminal TO1 and a second output terminal T02. A positive electrode of a battery (not shown), for example, is connected to a first power supply terminal TD1 and a negative electrode of the battery is connected to a second power supply terminal TD2.

The first electronic device T1 is a first switching device, in which one terminal is connected to the first power supply terminal TD1, and the other terminal is connected to the first output terminal T01.

The second electronic device T2 is a second switching device, in which one terminal is connected to the second output terminal TO2 and the other terminal is connected to the second power supply terminal TD2. The second switching device T2 is turned on or off in synchronization with the first switching device T1.

Therefore, the first device current I1 and the second device current I2 flow at the same time through the first switching device T1 and the second switching device T2.

The third electronic device T3 is a third switching device T3, in which one terminal is connected to the first output terminal TO1, and the other terminal is connected to the second power supply terminal TD2.

The fourth electronic device T4 is a fourth switching device T4, in which one terminal is connected to the first power supply terminal TD1 and the other terminal is connected to the second output terminal TO2. The fourth switching device T4 is turned on or off in synchronization with the third switching device T3.

Therefore, the third device current I3 and the fourth device current I4 flow at the same time through the third switching device T3 and the fourth switching device T4.

The first switching device T1 and the third switching device T3 are controlled to be complementarily turned on or off.

As in the case of Modification 1, the first electronic device T1 and the second electronic device T2 are arranged to reduce the mutual inductance in the semiconductor module MF1 including the full-bridge circuit according to Modification 2.

Therefore, a first magnetic flux generated by the first device current I1 flowing in the first current direction cancels a second magnetic flux generated by the second device current I2 flowing in the second current direction, thereby considerably reducing the mutual inductance.

Furthermore, the third electronic device T3 and the fourth electronic device T4 are arranged to reduce the mutual inductance.

Therefore, a third magnetic flux generated by the third device current I3 flowing in the third current direction cancels a fourth magnetic flux generated by the fourth device current I4 flowing in the fourth current direction, thereby considerably reducing the mutual inductance.

As described above, the semiconductor module MF1, which is a full-bridge circuit, is also capable of reducing the parasitic inductance. The reduction in parasitic inductance leads to a considerable reduction in voltage and current surge.

The regulation wiring line in the example described with reference to FIG. 1C may also be applied to the semiconductor module MF1 to reduce the mutual inductance.

As described above, the semiconductor modules according to this embodiment are capable of reducing the parasitic inductance.

In particular, the currents flowing through the semiconductor module are used to considerably reduce the parasitic inductance. The reduction in parasitic inductance leads to a considerable reduction in voltage and current surge of the semiconductor modules. Therefore, a considerable reduction in voltage and current surge is made possible with the compact size being maintained and a plurality of devices being mounted.

Second Embodiment

An example of a configuration of a semiconductor module having a stack structure according to a second embodiment will be described. For example, the semiconductor module MF1 with a full-bridge circuit having been described with reference to FIG. 4 may be applied to the second embodiment. First to fourth electronic devices in this embodiment are switching devices (MOSFETs) in the following explanations, but the explanations are the same for other switching devices such as bipolar transistors and other transistors. Furthermore, the first to fourth electronic devices may be rectifier devices such as diodes.

Figure 5A:
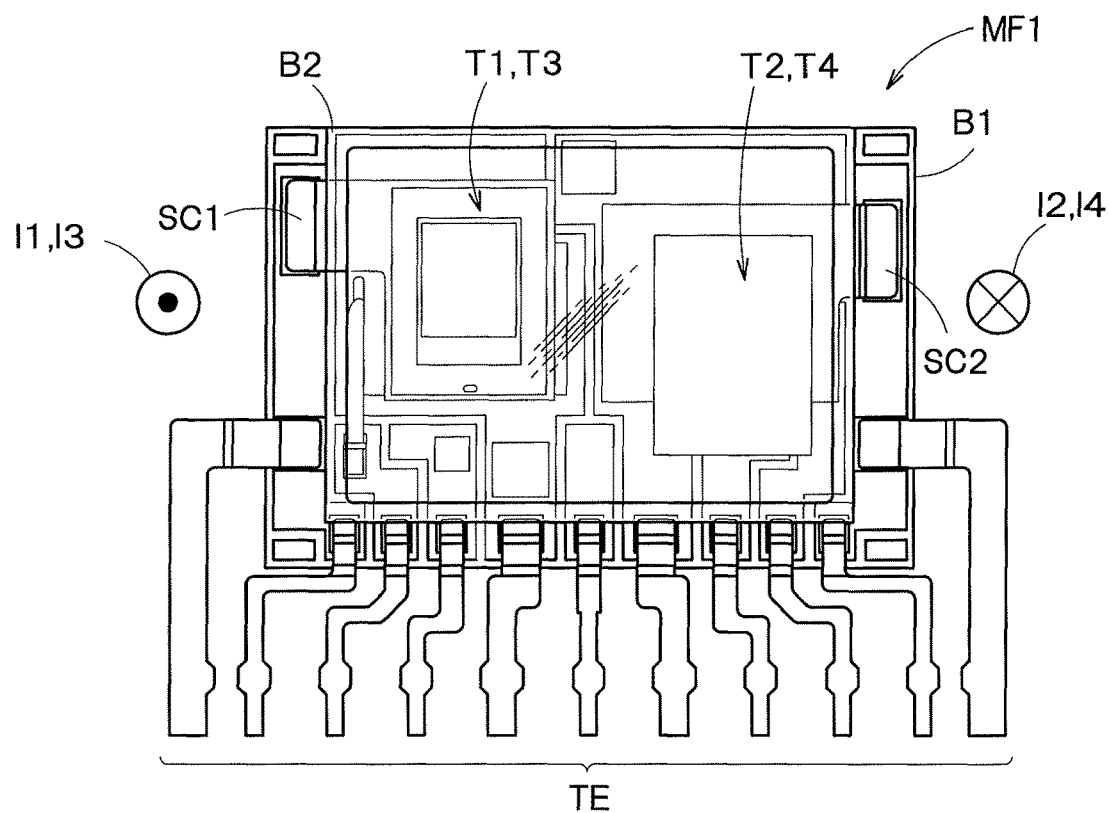
FIG. 5A is a plan view showing an example of an arrangement of a semiconductor module having a stack structure according to a second embodiment.
Figure 5B:
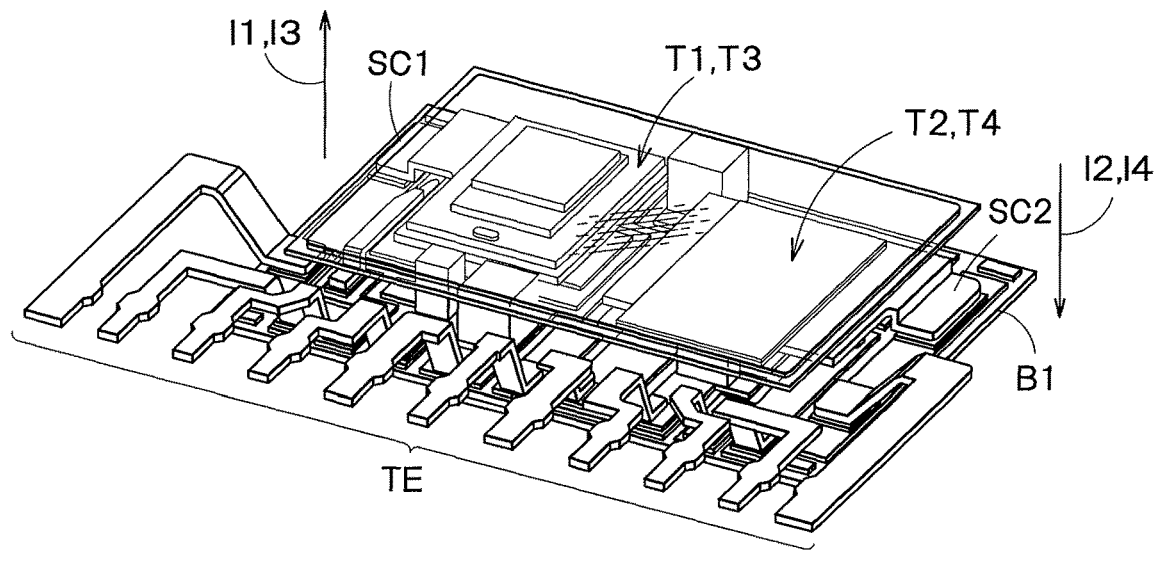
FIG. 5B is a perspective view showing an example of an arrangement of the semiconductor module shown in FIG. 5A.
Figure 8A:
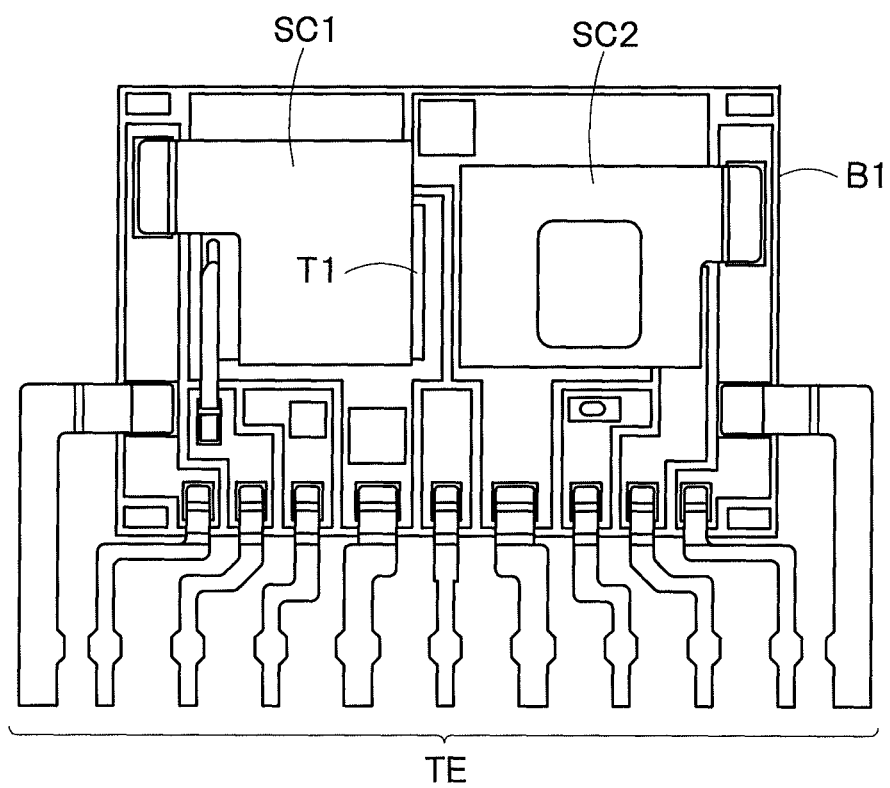
FIG. 8A is a plan view developed for explaining the respective elements of the semiconductor module shown in FIG. 5A.
Figure 8B:
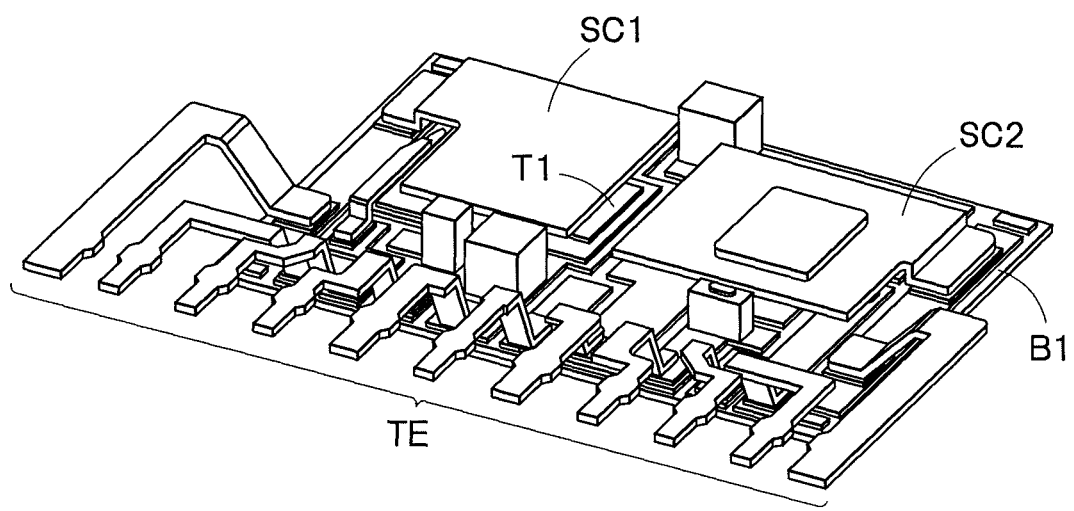
FIG. 8B is a perspective view developed for explaining the respective elements of the semiconductor module shown in FIG. 5B.

FIG. 5A is a plan view showing an example of an arrangement of a semiconductor module having a stack structure according to the second embodiment. FIG. 5B is a perspective view showing the example of the arrangement of the semiconductor module shown in FIG. 5A. FIGS. 6A to 11A are plan views developed for explaining the respective elements of the semiconductor module shown in FIG. 5A. FIGS. 6B to 11B are perspective views developed for explaining the respective elements of the semiconductor module shown in FIG. 5B.

In FIGS. 5A and 5B, a second wiring line substrate B2 is illustrated to be transparent to show the underneath. Furthermore, in FIGS. 5A and 5B, the first to fourth device currents I1 to I4 are illustrated outside the semiconductor module MF1 for convenience of explanation. The reference signs in FIGS. 5A and 5B which are the same as those in FIG. 4 denote the same elements as the first embodiment.

For example, the semiconductor module MF1 having the stack structure includes a first wiring line substrate B1, a first electronic device T1, a second electronic device T2, a first connection wiring layer SC1, a second connection wiring layer SC2, a third electronic device T3, a fourth electronic device T4, the second wiring line substrate B2, and terminals TE, as shown in FIGS. 5A to 11A and FIGS. 5B to 11B.

The first wiring line substrate B1 includes a wiring pattern (electrode) B1a and a conductor layer B1b for electrically connecting to respective terminals and wiring lines (FIGS. 5A, 5B, 6A, and 6B).

The first electronic device T1 is disposed above the first wiring line substrate B1 (FIGS. 5A, 5B, 7A, and 7B). One terminal (drain disposed on the lower side) of the first electronic device T1 is electrically connected to the first wiring line substrate B1.

The first device current I1 flows in a first current direction from the one terminal (drain disposed on the lower side) to the other terminal (source disposed on the upper side) of the first electronic device T1.

The second electronic device T2 is disposed above the first wiring line substrate B1 in the vicinity of the first electronic device T1. One terminal (source disposed on the lower side) of the second electronic device T2 is electrically connected to the first wiring line substrate B1 (FIGS. 5A, 5B, 7A, and 7B).

The second device current I2 flows in a second current direction from the other terminal (drain on the upper side) to the one terminal (source disposed on the lower side) of the second electronic device T2.

The first connection wiring layer SC1 is disposed above the first electronic device T1 (FIGS. 5A, 5B, 8A, and 8B). The first connection wiring layer SC1 is electrically connected to the other terminal (source on the upper side) of the first electronic device T1.

The second connection wiring layer SC2 is disposed above the second electronic device T2 in the vicinity of the first connection wiring layer SC1, and electrically connected to the other terminal (drain on the upper side) of the second electronic device T2 (FIGS. 5A, 5B, 8A, and 8B).

The third electronic device T3 is disposed above the first connection wiring layer SC1 (FIGS. 5A, 5B, 9A, and 9B).

One terminal (drain on the lower side) of the third electronic device T3 is electrically connected to the first connection wiring layer SC1.

The third device current I3 flows in a third current direction from the one terminal (drain on the lower side) to the other terminal (source on the upper side) of the third electronic device T3.

The fourth electronic device T4 is disposed above the second connection wiring layer SC2 in the vicinity of the third electronic device T3 (FIGS. 5A, 5B, 9A, and 9B). One terminal (source on the lower side) of the fourth electronic device T4 is electrically connected to the second connection wiring layer SC2.

The fourth device current I4 flows in a fourth current direction from the other terminal (drain on the upper side) to the one terminal (source on the lower side) of the fourth electronic device T4.

Figure 10A:
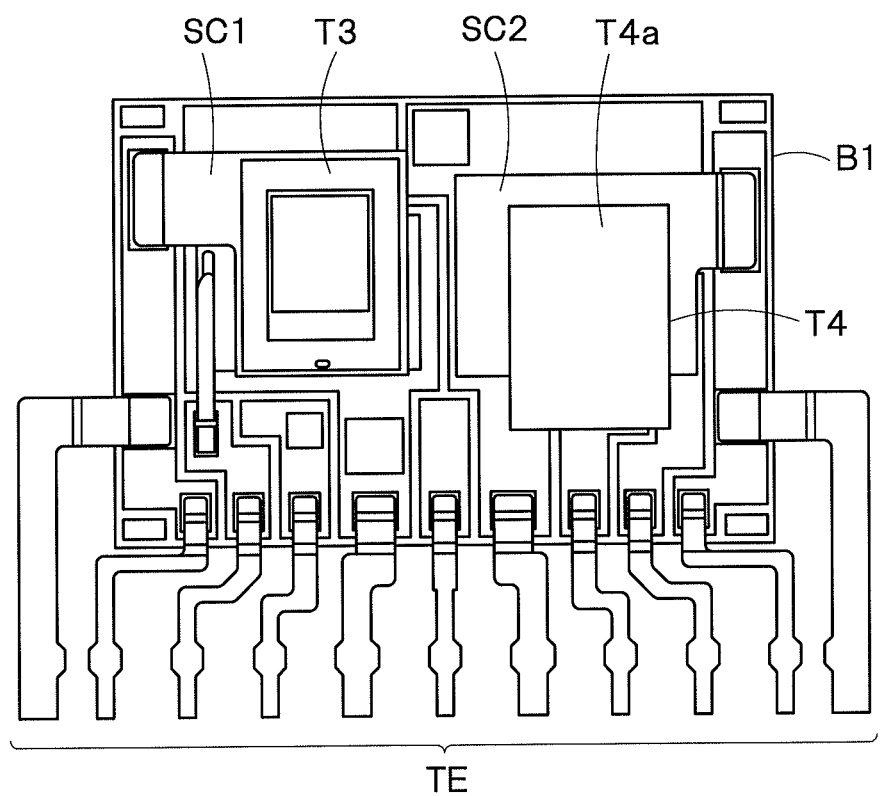
FIG. 10A is a plan view developed for explaining the respective elements of the semiconductor module shown in FIG. 5A.
Figure 10B:
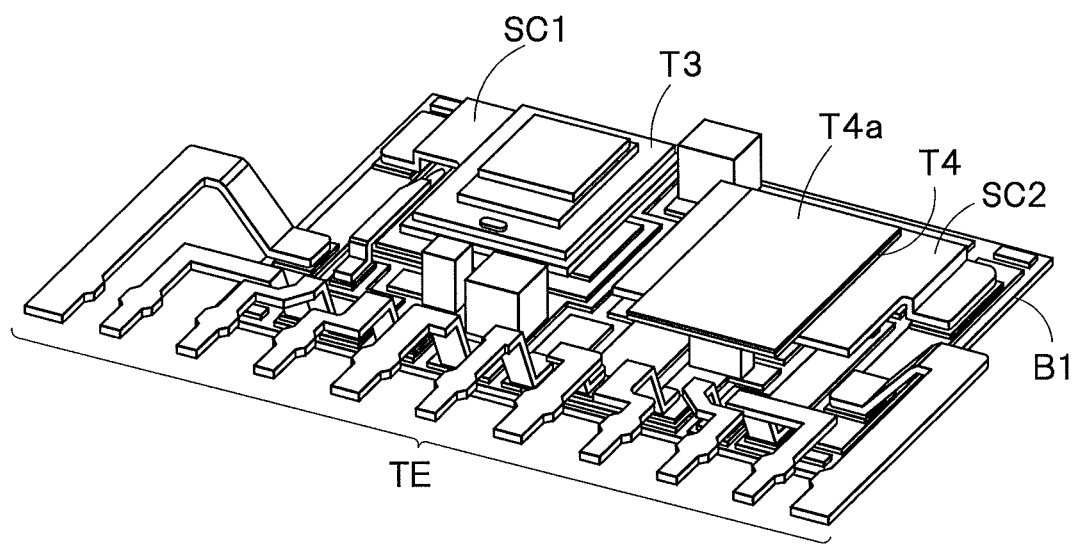
FIG. 10B is a perspective view developed for explaining the respective elements of the semiconductor module shown in FIG. 5B.

As shown in FIGS. 10A and 10B, a conductor layer T4a is disposed at the other terminal (drain on the upper side) of the fourth electronic device T4.

Wiring lined and conductor layers for connecting to respective terminals and wiring lines, if necessary, are connected to the first to fourth electronic devices T1 to T4.

The second wiring line substrate B2 is disposed above the third electronic device T3 and the fourth electronic device T4 (FIGS. 5A, 5B, 11A, and 11B). The second wiring line substrate B2 includes a wiring pattern and a conductor layer for connecting to respective terminals and wiring lines. The second wiring line substrate B2 is electrically connected to the other terminal (source on the upper side) of the third electronic device T3 and the other terminal (drain on the upper side) of the fourth electronic device T4.

A sealing material (not shown) is disposed between the first wiring line substrate B1 and the second wiring line substrate B2.

Characteristics of the semiconductor module MF1 having the above-described structure will be described below.

As described above, the first device current I1 flows in the first current direction from the one terminal (drain on the lower side) to the other terminal (source on the upper side) of the first electronic device T1. The second device current I2 flows in the second current direction from the other terminal (drain on the upper side) to the one terminal (source on the lower side) of the second electronic device T2. The third device current I3 flows in the third current direction from the one terminal (drain on the lower side) to the other terminal (source on the upper side) of the third electronic device T3. The fourth device current I4 flows in the fourth current direction from the other terminal (drain on the upper side) to the one terminal (source on the lower side) of the fourth electronic device T4.

At least part of a magnetic flux generated by the first device current I1 flowing through the first electronic device T1 and a magnetic flux generated by the third device current I3 flowing through the third electronic device T3 cancels at least part of a magnetic flux generated by the second device current I2 flowing through the second electronic device T2 and a magnetic flux generated by the fourth device current I4 flowing through the fourth electronic device T4 to reduce mutual inductance.

As described above, the semiconductor module MF1 has a stack module structure, and is configured to cause a current to flow in an opposite direction to a current flowing through one of the arms in the three-dimensional structure instead of a planar direction with the compact size of the semiconductor module MF1 being maintained. This considerably reduces the parasitic inductance.

With such a stack structure, a noise canceller structure with a plurality of electronic device s may be easily formed.

The other elements of the semiconductor module MF1 are the same as those of the semiconductor modules according to the first embodiment.

Thus, the semiconductor module according to the second embodiment is capable of reducing the parasitic inductance.

In particular, the parasitic inductance may be considerably reduced by using currents that flow in the semiconductor module. The reduction in the parasitic inductance leads to a considerable reduction in voltage and current surge of the semiconductor module. Therefore, a considerable reduction in voltage and current surge is made possible with the compact size being maintained and a plurality of devices being mounted.

Third Embodiment

Another example of a semiconductor module having a stack structure according to a third embodiment will be described. Like the second embodiment, a semiconductor module MF1 including a full-bridge circuit shown in FIG. 4 is applied to the third embodiment. First to fourth electronic devices in this embodiment are switching devices (MOSFETs) in the following explanations, but the explanations are the same for other switching devices such as bipolar transistors and other transistors. Furthermore, the first to fourth electronic devices may be rectifier devices such as diodes.

Figure 12A:
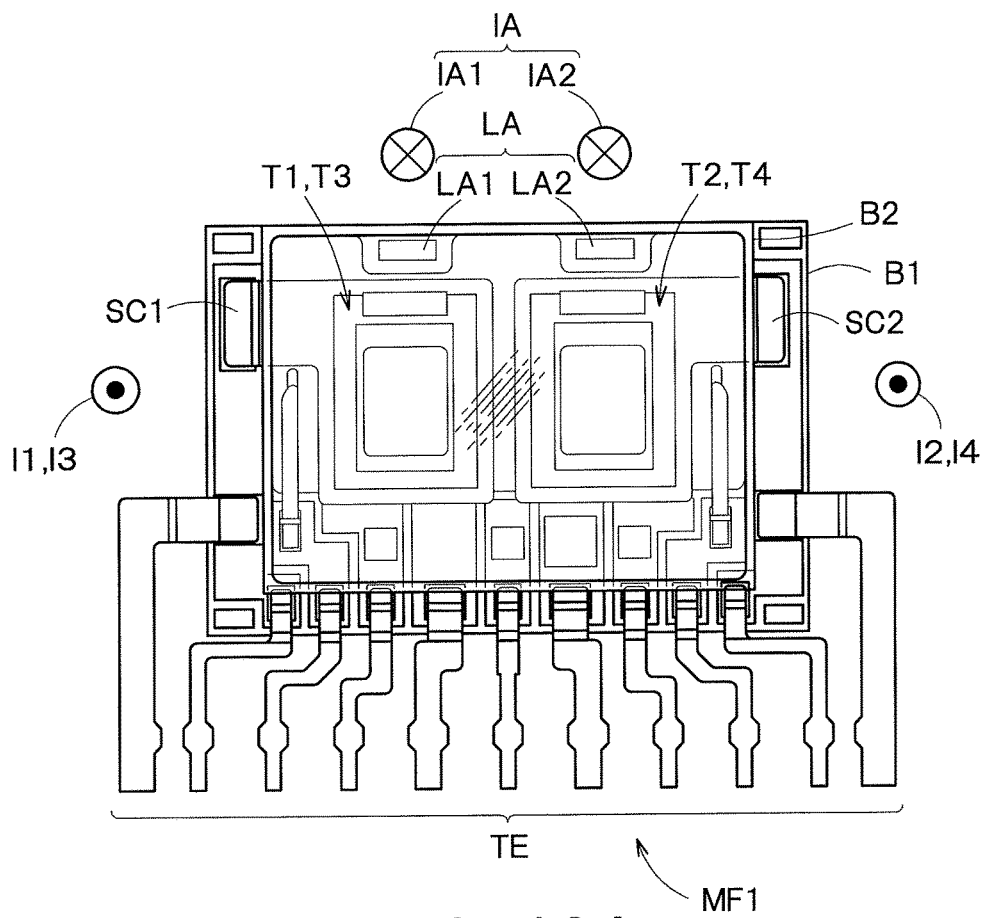
FIG. 12A is a plan view showing an example of an arrangement of a semiconductor module having a stack structure according to the third embodiment.
Figure 12B:
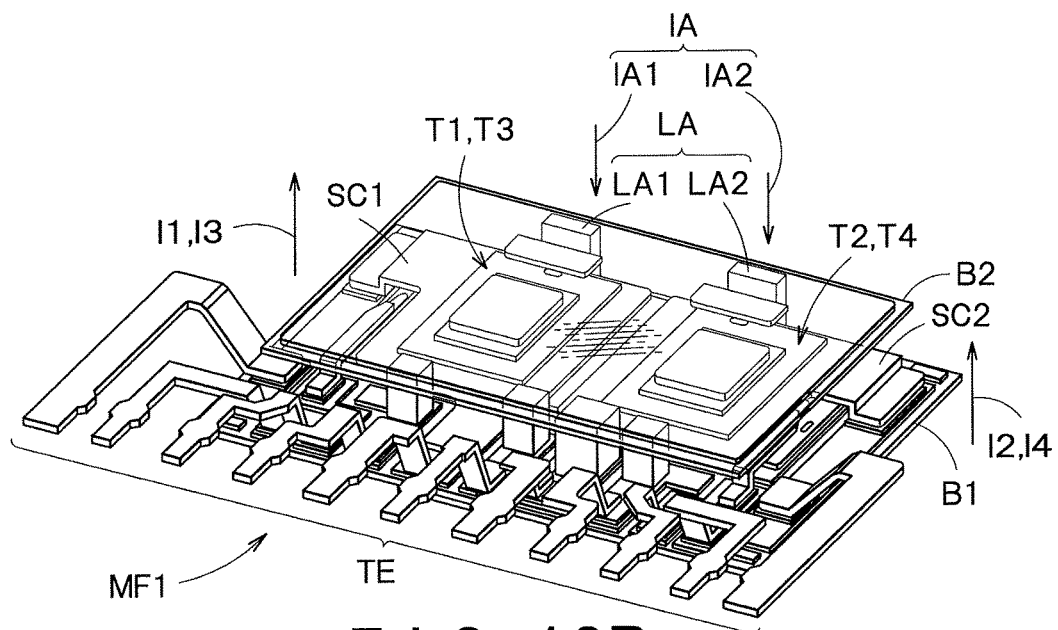
FIG. 12B is a perspective view showing an example of an arrangement of the semiconductor module shown in FIG. 12A.
Figure 14A:
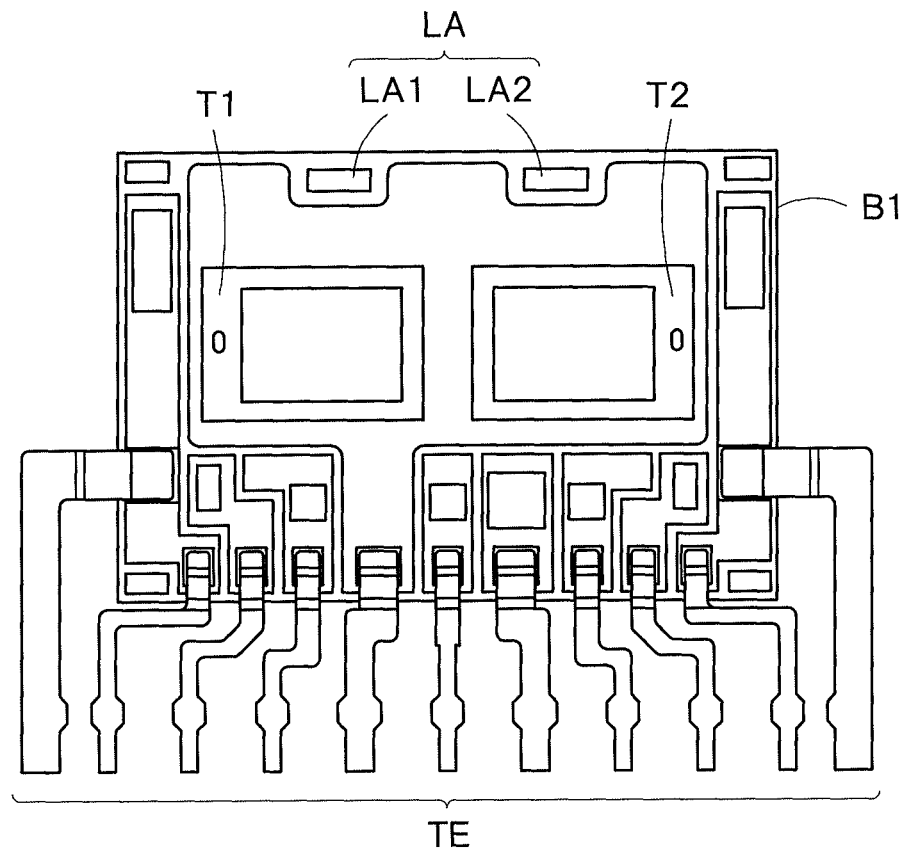
FIG. 14A is a plan view developed for explaining the respective elements of the semiconductor module shown in FIG. 12A.
Figure 14B:
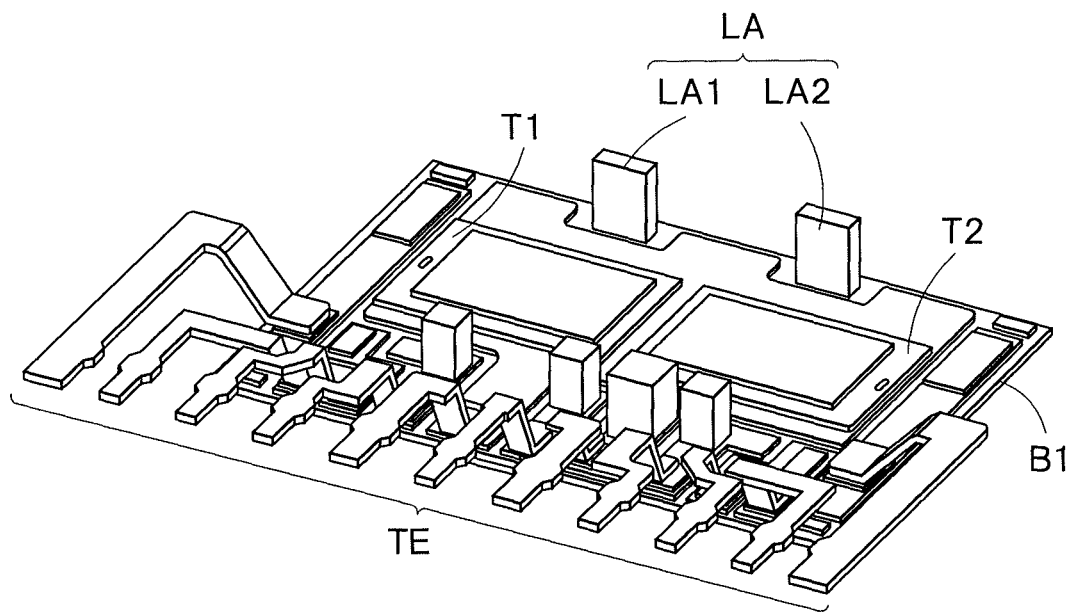
FIG. 14B is a perspective view developed for explaining the respective elements of the semiconductor module shown in FIG. 12B.

FIG. 12A is a plan view showing an example of an arrangement of a semiconductor module having a stack structure according to the third embodiment. FIG. 12B is a perspective view showing an example of an arrangement of the semiconductor module shown in FIG. 12A. FIGS. 13A to 18A are plan views developed for explaining the respective elements of the semiconductor module shown in FIG. 12A. FIGS. 13B to 18B are perspective views developed for explaining the respective elements of the semiconductor module shown in FIG. 12B.

In FIGS. 12A and 12B, a second wiring line substrate B2 is illustrated to be transparent to show the underneath. Furthermore, in FIGS. 12A and 12B, first to fourth device currents I1 to I4 and regulation currents IA are illustrated outside the semiconductor module MF1 for convenience of explanation. The reference signs in FIGS. 12A and 12B, which are the same as those in FIGS. 5A and 5B, denote the same elements as the second embodiment.

For example, the semiconductor module MF1 having the stack structure includes a first wiring line substrate B1, a first electronic device T1, a second electronic device T2, a first connection wiring layer SC1, a second connection wiring layer SC2, a third electronic device T3, a fourth electronic device T4, the second wiring line substrate B2, terminals TE, and regulation wiring lines LA as shown in FIGS. 12A to 18A and FIGS. 12B to 18B.

The first wiring line substrate B1 includes a wiring pattern (electrode) B1a and a conductor layer B1b for electrically connecting respective terminals and wiring lines (FIGS. 12A, 12B, 13A, and 13B).

The first electronic device T1 is disposed above the first wiring line substrate B1 (FIGS. 12A, 12B, 14A, and 14B). One terminal (drain on the lower side) of the first electronic device T1 is electrically connected to the first wiring line substrate B1.

The first device current I1 flows in a first current direction flowing from the one terminal (drain on the lower side) to the other terminal (source on the upper side) of the first electronic device T1.

The second electronic device T2 is disposed above the first wiring line substrate B1 in the vicinity of the first electronic device T1. One terminal (drain on the lower side) of the second electronic device T2 is electrically connected to the first wiring line substrate B1 (FIGS. 12A, 12B, 14A, and 14B).

The second device current I2 flows in a second current direction from the one terminal (drain on the lower side) to the other terminal (source on the upper side) of the second electronic device T2.

The first connection wiring layer SC1 is disposed above the first electronic device T1 (FIGS. 12A, 12B, 15A, and 15B). The first connection wiring layer SC1 is electrically connected to the other terminal (source on the upper side) of the first electronic device T1.

The second connection wiring layer SC2 is disposed above the second electronic device T2 in the vicinity of the first connection wiring layer SC1, and electrically connected to the other terminal (source on the upper side) of the second electronic device T2 (FIGS. 12A, 12B, 15A, and 15B).

The third electronic device T3 is disposed above the first connection wiring layer SC1 (FIGS. 12A, 12B, 16A, and 16B). One terminal (drain on the lower side) of the third electronic device T3 is electrically connected to the first connection wiring layer SC1.

The third device current I3 flows in a third current direction from the one terminal (drain on the lower side) to the other terminal (source on the upper side) of the third electronic device T3.

The fourth electronic device T4 is disposed above the second connection wiring layer SC2 in the vicinity of the third electronic device T3 (FIGS. 12A, 12B, 16A, and 16B). One terminal (drain on the lower side) of the fourth electronic device T4 is electrically connected to the second connection wiring layer SC2.

The fourth device current I4 flows in a fourth current direction from the one terminal (drain on the lower side) to the other terminal (source on the upper side) of the fourth electronic device T4.

As shown in FIGS. 17A and 17B, a conductor layer T3a is disposed to the other terminal (source on the upper side) of the third electronic device T3, and a conductor T4a is disposed to the other terminal (source on the upper side) of the fourth electronic device T4.

As in the case of the second embodiment, wiring lines and conductor layers for connecting to respective terminals and wiring lines, if necessary, are connected to the first to fourth electronic devices T1 to T4.

The second wiring line substrate B2 is disposed above the third electronic device T3 and the fourth electronic device T4 (FIGS. 12A, 12B, 18A, and 18B). The second wiring line substrate B2 includes a wiring pattern and a conductor layer for connecting to respective terminals and wiring lines. The second wiring line substrate B2 is electrically connected to the other terminal (source on the upper side) of the third electronic device T3 and the other terminal (source on the upper side) of the fourth electronic device T4.

As in the case of the second embodiment, a sealing material (not shown) is disposed between the first wiring line substrate B1 and the second wiring line substrate B2.

The regulation wiring lines LA are disposed in an inactive region of the semiconductor module MF1 to extend between the first wiring line substrate B1 and the second wiring line substrate B2.

The regulation currents IA, which are different from the first to fourth device currents I1 to I4, flow through the regulation wiring lines LA in a fifth current direction from the second wiring line substrate B2 to the first wiring line substrate B1 (a direction opposite to the first to fourth current direction).

The regulation wiring lines LA include a first regulation wiring line LA1, which is disposed in the vicinity of the first and third electronic devices T1 and T3 and through which a first regulation current IA1 flows, and a second regulation wiring line LA2, which is disposed in the vicinity of the second and fourth electronic devices T2 and T4 and through which a second regulation current IA2 flows.

At least part of a magnetic flux generated by the first regulation current IA1 cancels at least part of a magnetic flux generated by the first and third device currents I1 and I3 to reduce mutual inductance.

Furthermore, at least part of a magnetic flux generated by the second regulation current IA2 cancels at least part of a magnetic flux generated by the second and fourth device currents I2 and I4 to reduce mutual inductance.

As described above, at least part of the magnetic flux generated by the regulation currents IA cancels at least part of the magnetic flux generated by the first to fourth device currents I1 to I4 to reduce the mutual inductance.

The regulation wiring lines IA may be formed by changing the layout of the wiring lines extending between the first wiring line substrate B1 and the second wiring line substrate B2 in the semiconductor module MF1 (for example, wiring lines connecting to the power supply).

Thus, the surge may be considerably reduced by cancelling the inductance by disposing the current paths in the inactive region, in which currents flow in a direction opposite to the direction of the device currents in the stack module structure of the semiconductor module MF1.

The other elements and functions of the semiconductor module MF1 are the same as those of the semiconductor module according to the second embodiment.

Thus, the semiconductor module according to the third embodiment is capable of reducing the parasitic inductance, like the semiconductor module according to the second embodiment.

Especially, the parasitic inductance may be considerably reduced by using the currents flowing in the semiconductor module. The reduction in the parasitic inductance leads to a considerable reduction in the voltage and current surge of the semiconductor module. Therefore, a considerable reduction in the surge is made possible with the compact size being maintained and a plurality of devices being mounted.

While certain embodiments have been described, these embodiments have been presented by way of example only, and are not intended to limit the scope of the inventions. The embodiments may be carried out in various other forms. Furthermore, various omissions, substitutions and changes may be made in the embodiments without departing from the spirit of the inventions. The embodiments and their modifications are included in the scope and the subject matter of the invention, and at the same time included in the scope of the claimed inventions and their equivalents.

EXPLANATION OF REFERENCES

M1, MH1, MF1: semiconductor module
T1: first electronic device
T2: second electronic device
T3: third electronic device
T4: fourth electronic device
I1: first device current
I2: second device current I3: third device current
I4: fourth device current

The invention claimed is:

1. A semiconductor module comprising:
a first electronic device in which one terminal is connected to a first wiring line, the other terminal is connected to a second wiring line, and a first device current flows in a first current direction from the first wiring line to the second wiring line;
a second electronic device in which one terminal is connected to a third wiring line, the other terminal is connected to a fourth wiring line, and a second device current flows in a second current direction from the third wiring line to the fourth wiring line;
a regulation wiring line in which a regulation current that is different from the first device current and the second device current flows;
a third electronic device in which one terminal is connected to a fifth wiring line, the other terminal is connected to a sixth wiring line, and a third device current flows in a third current direction from the fifth wiring line to the sixth wiring line; and
a fourth electronic device in which one terminal is connected to a seventh wiring line, the other terminal is connected to a eighth wiring line, and a fourth device current flows in a fourth current direction from the seventh wiring line to the eighth wiring line,
wherein:
the first electronic device and the second electronic device are arranged so that at least part of a first magnetic flux generated by the first device current flowing in the first current direction cancels at least part of a second magnetic flux generated by the second device current flowing in the second current direction to reduce mutual inductance;
the third electronic device and the fourth electronic device are arranged so that at least part of a third magnetic flux generated by the third device current flowing in the third current direction cancels at least part of a fourth magnetic flux generated by the fourth device current flowing in the fourth current direction to reduce mutual inductance;
the regulation wiring line is arranged so that at least part of a magnetic flux generated by the regulation current flowing in the regulation wiring line cancels at least part of the first magnetic flux to reduce mutual inductance;
the first current direction in which the first device current flows and the second current direction in which the second device current flows are parallel to each other, and a value of the first device current is the same as a value of the second device current;
the first electronic device is a first switching device in which one terminal is connected to a first power supply terminal and the other terminal is connected to a first output terminal;
the second electronic device is a second switching device in which one terminal is connected to a second output terminal and the other terminal is connected to a second power supply terminal, the second electronic device being controlled to be turned on or off in synchronization with the first switching device;
the third electronic device is a third switching device in which one terminal is connected to the first output terminal and the other terminal is connected to the second power supply terminal;
the fourth electronic device is a fourth switching device in which one terminal is connected to the first power supply terminal and the other terminal is connected to the second output terminal, the fourth electronic device being controlled to be turned on or off in synchronization with the third switching device; and
the first switching device and the third switching device are controlled to be complementarily turned on or off.

2. The semiconductor module according to claim 1, wherein the third current direction in which the third device current flows and the fourth current direction in which the fourth device current flows are parallel to each other.

3. The semiconductor module according to claim 2, wherein a value of the third device current is the same as a value of the fourth device current.

4. A semiconductor module comprising:
a first electronic device in which one terminal is connected to a first wiring line, the other terminal is connected to a second wiring line, and a first device current flows in a first current direction from the first wiring line to the second wiring line;
a second electronic device in which one terminal is connected to a third wiring line, the other terminal is connected to a fourth wiring line, and a second device current flows in a second current direction from the third wiring line to the fourth wiring line;
a regulation wiring line in which a regulation current that is different from the first device current and the second device current flows;
a third electronic device in which one terminal is connected to a fifth wiring line, the other terminal is connected to a sixth wiring line, and a third device current flows in a third current direction from the fifth wiring line to the sixth wiring line; and
a fourth electronic device in which one terminal is connected to a seventh wiring line, the other terminal is connected to a eighth wiring line, and a fourth device current flows in a fourth current direction from the seventh wiring line to the eighth wiring line,
wherein:
the first electronic device and the second electronic device are arranged so that at least part of a first magnetic flux generated by the first device current flowing in the first current direction cancels at least part of a second magnetic flux generated by the second device current flowing in the second current direction to reduce mutual inductance;
the third electronic device and the fourth electronic device are arranged so that at least part of a third magnetic flux generated by the third device current flowing in the third current direction cancels at least part of a fourth magnetic flux generated by the fourth device current flowing in the fourth current direction to reduce mutual inductance;
the regulation wiring line is arranged so that at least part of a magnetic flux generated by the regulation current flowing in the regulation wiring line cancels at least part of the first magnetic flux to reduce mutual inductance;
the first current direction in which the first device current flows and the second current direction in which the second device current flows are parallel to each other, and a value of the first device current is the same as a value of the second device current;

the first electronic device is a first switching device in which one terminal is connected to a first power supply terminal and the other terminal is connected to a first output terminal;
the second electronic device is a second switching device in which one terminal is connected to the first power supply terminal and the other terminal is connected to the first output terminal, the second electronic device being controlled to be turned on or off in synchronization with the first switching device;
the third electronic device is a third switching device in which one terminal is connected to the first output terminal and the other terminal is connected to the second power supply terminal;
the fourth electronic device is a fourth switching device in which one terminal is connected to the first output terminal and the other terminal is connected to the second power supply terminal, the fourth electronic device being controlled to be turned on or off in synchronization with the third switching device; and
the first switching device and the third switching device are controlled to be complementarily turned on or off.

5. A semiconductor module comprising:
a first wiring line substrate;
a first electronic device disposed above the first wiring line substrate, one terminal of the first electronic device being electrically connected to the first wiring line substrate;
a first connection wiring layer disposed above the first electronic device and electrically connected to the other terminal of the first electronic device;
a second electronic device disposed above the first wiring line substrate in the vicinity of the first electronic device, one terminal of the second electronic device being electrically connected to the first wiring line substrate;
a second connection wiring layer disposed above the second electronic device in the vicinity of the first connection wiring layer, and connected to the other terminal of the second electronic device;
a third electronic device disposed above the first connection wiring layer, one terminal of the third electronic device being electrically connected to the first connection wiring layer;
a fourth electronic device disposed above the second connection wiring layer in the vicinity of the third electronic device, one terminal of the fourth electronic device being electrically connected to the second connection wiring layer; and
a second wiring line substrate disposed above the third electronic device and the fourth electronic device, and electrically connected to the other terminal of the third electronic device and the other terminal of the fourth electronic device,
wherein:
a first device current flows in a first current direction from the one terminal to the other terminal of the first electronic device;
a second device current flows in a second current direction from the other terminal to the one terminal of the second electronic device;
a third device current flows in a third current direction from the one terminal to the other terminal of the third electronic device,
a fourth device current flows in a fourth current direction from the other terminal to the one terminal of the fourth electronic device; and
at least part of a magnetic flux generated by the first drive current and the third device current cancels at least part of a magnetic flux generated by the second drive current and the fourth to reduce mutual inductance.

6. A semiconductor module comprising:
a first wiring line substrate;
a first electronic device disposed above the first wiring line substrate, one terminal of the first electronic device being electrically connected to the first wiring line substrate;
a first connection wiring layer disposed above the first electronic device and electrically connected to the other terminal of the first electronic device;
a second electronic device disposed above the first wiring line substrate in the vicinity of the first electronic device, one terminal of the second electronic device being electrically connected to the first wiring line substrate;
a second connection wiring layer disposed above the second electronic device in the vicinity of the first connection wiring layer, and electrically connected to the other terminal of the second electronic device,
a third electronic device disposed above the first connection wiring layer, one terminal of the third electronic device being electrically connected to the first connection wiring layer;
a fourth electronic device disposed above the second connection wiring layer in the vicinity of the third electronic device, one terminal of the fourth electronic device being electrically connected to the second connection wiring layer;
a second wiring line substrate disposed above the third electronic device and the fourth electronic device; and
a regulation wiring line disposed to extend between the first wiring line substrate and the second wiring line substrate,
wherein:
a first device current flows in a first current direction from the one terminal to the other terminal of the first electronic device;
a second device current flows in a second current direction from the one terminal to the other terminal of the second electronic device;
a third device current flows in a third current direction from the one terminal to the other terminal of the third electronic device;
a fourth device current flows in a fourth current direction from the one terminal to the other terminal of the fourth electronic device;
a regulation current that is different from the first to fourth device currents flows through the regulation wiring line in a fifth current direction from the second wiring line substrate to the first wiring line substrate; and
at least part of a magnetic flux generated by the regulation current cancels at least part of a magnetic flux generated by the first to fourth device currents to reduce mutual inductance.

7. The semiconductor module according to claim 6, wherein:
the regulation wiring line includes a first regulation wiring line which is disposed in the vicinity of the first and third electronic devices and in which a first regulation current flows, and a second regulation wiring line which is disposed in the vicinity of the second and fourth electronic devices and in which a second regulation current flows;

at least part of a magnetic flux generated by the first regulation current cancels at least part of a magnetic flux generated by the first and third device currents to reduce mutual inductance; and at least part of a magnetic flux generated by the second regulation current cancels at least part of a magnetic flux generated by the second and fourth device currents to reduce mutual inductance.

8. The semiconductor module according to claim 1, wherein the first electronic device is a switching device or rectifier device, and the second electronic device is a switching device or rectifier device.

9. The semiconductor module according to claim 8, wherein the switching device is a transistor.

10. The semiconductor module according to claim 8, wherein the rectifier device is a diode.

* * * * *